United States Patent
Kim et al.

(10) Patent No.: US 10,685,980 B2
(45) Date of Patent: Jun. 16, 2020

(54) THREE-DIMENSIONAL SEMICONDUCTOR MEMORY DEVICE INCLUDING A PENETRATION REGION PASSING THROUGH A GATE ELECTRODE

(71) Applicant: SAMSUNG ELECTRONICS CO., LTD., Suwon-si, Gyeonggi-Do (KR)

(72) Inventors: Kwang Soo Kim, Hwaseong-si (KR); Si Wan Kim, Hwaseong-si (KR); Jun Hyoung Kim, Seoul (KR); Kyoung Taek Oh, Osan-si (KR); Bong Hyun Choi, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/268,642

(22) Filed: Feb. 6, 2019

(65) Prior Publication Data

US 2019/0393240 A1 Dec. 26, 2019

(30) Foreign Application Priority Data

Jun. 22, 2018 (KR) .................. 10-2018-0072302

(51) Int. Cl.
| | |
|---|---|
| H01L 29/792 | (2006.01) |
| H01L 27/11582 | (2017.01) |
| H01L 27/11565 | (2017.01) |
| H01L 29/423 | (2006.01) |
| H01L 27/1157 | (2017.01) |
| H01L 29/06 | (2006.01) |
| H01L 27/11573 | (2017.01) |

(52) U.S. Cl.
CPC .... H01L 27/11582 (2013.01); H01L 27/1157 (2013.01); H01L 27/11565 (2013.01); H01L 27/11573 (2013.01); H01L 29/0642 (2013.01); H01L 29/4234 (2013.01)

(58) Field of Classification Search
CPC ......... H01L 27/11582; H01L 27/11565; H01L 27/1157; H01L 27/11573; H01L 29/0642; H01L 29/4234
USPC .................................................. 257/324
See application file for complete search history.

(56) References Cited

U.S. PATENT DOCUMENTS

| | | |
|---|---|---|
| 8,405,142 B2 | 3/2013 | Katsumata et al. |
| 9,165,937 B2 | 10/2015 | Yip et al. |
| 9,165,941 B2 * | 10/2015 | Yang ............... H01L 27/11582 |
| 9,343,405 B2 | 5/2016 | Matsuda |
| 9,419,009 B1 | 8/2016 | Oh et al. |
| 9,515,084 B2 | 12/2016 | Oh et al. |
| 9,659,950 B2 | 5/2017 | Yip et al. |
| 2017/0256551 A1 | 9/2017 | Lee |

(Continued)

*Primary Examiner* — David S Blum
(74) *Attorney, Agent, or Firm* — F. Chau & Associates, LLC

(57) ABSTRACT

A three-dimensional semiconductor memory device includes: a base substrate; a gate stack structure disposed on the base substrate, and including gate electrodes stacked in a direction substantially perpendicular to a top surface of the base substrate; a penetration region penetrating through the gate stack structure and surrounded by the gate stack structure; and vertical channel structures passing through the gate stack structure. The lowermost gate electrodes among the gate electrodes are spaced apart from each other, and a portion of at least one of the lowermost gate electrodes has a shape bent toward the penetration region.

20 Claims, 19 Drawing Sheets

(56) References Cited

U.S. PATENT DOCUMENTS

| | | | |
|---|---|---|---|
| 2018/0151672 A1* | 5/2018 | Choi | H01L 27/11524 |
| 2019/0237477 A1* | 8/2019 | Baek | H01L 27/11582 |
| 2019/0304991 A1* | 10/2019 | Seo | H01L 27/11573 |
| 2019/0378855 A1 | 12/2019 | Kim et al. | |
| 2020/0020716 A1* | 1/2020 | Kim | H01L 27/11565 |

* cited by examiner

THREE-DIMENSIONAL SEMICONDUCTOR MEMORY DEVICE INCLUDING A PENETRATION REGION PASSING THROUGH A GATE ELECTRODE

CROSS-REFERENCE TO RELATED APPLICATION(S)

This application claims priority under 35 U.S.C. § 119 to Korean Patent Application No. 10-2018-0072302 filed on Jun. 22, 2018 in the Korean Intellectual Property Office, the disclosure of which is incorporated by reference herein in its entirety.

TECHNICAL FIELD

Exemplary embodiments of the present inventive concept relate to a semiconductor device, and more particularly, to a three-dimensional semiconductor memory device including a penetration region passing through a gate structure.

DISCUSSION OF THE RELATED ART

Semiconductor devices including gate electrodes stacked on a semiconductor substrate are under development. The number of stacked gate electrodes is increased to increase a degree of integration of semiconductor devices. As the number of stacked gate electrodes gradually increases, defects may occur when connecting the gate electrodes to peripheral circuits.

SUMMARY

According to an exemplary embodiment of the present inventive concept, a three-dimensional semiconductor memory device includes: a base substrate; a gate stack structure disposed on the base substrate, and including gate electrodes stacked in a direction substantially perpendicular to a top surface of the base substrate; a penetration region penetrating through the gate stack structure and surrounded by the gate stack structure; and vertical channel structures passing through the gate stack structure. The lowermost gate electrodes among the gate electrodes are spaced apart from each other, and a portion of at least one of the lowermost gate electrodes has a shape bent toward the penetration region.

According to an exemplary embodiment of the present inventive concept, a three-dimensional semiconductor memory device includes: a base substrate; memory cell array regions disposed on the base substrate; a first inner stepped region and a second inner stepped region disposed between the memory cell array regions; a bridge region disposed between the first and second inner stepped regions; a gate stack structure including word lines stacked in the memory cell array regions and extending to the first and second inner stepped regions in a first direction, and lower select lines disposed below the word lines; and a penetration region penetrating through the gate stack structure in the bridge region. The word lines respectively extend from the memory cell array regions to the bridge region and are connected in the bridge region, the lower select lines are spaced apart from each other in the bridge region, and a portion of at least one of the lower select lines includes an extended portion bent in a second direction intersecting the first direction.

According to an exemplary embodiment of the present inventive concept, a three-dimensional semiconductor memory device includes: a base substrate; a first gate stack structure and a second gate stack structure stacked on the base substrate; a penetration region surrounded by the first and second gate stack structures, and penetrating through the first and second gate stack structures; and vertical channel structures passing through the first and second gate stack structures. The first and second gate stack structures include word lines extending in a first direction, and the first gate stack structure further includes lower select lines disposed below the word lines, and a portion of at least one of the lower select lines includes an extended portion bent toward the penetration region in a second direction different from the first direction. A lower contact pad is disposed on the extended portion.

BRIEF DESCRIPTION OF DRAWINGS

The above and other features of the present inventive concept will become more apparent by describing in detail exemplary embodiments thereof, with reference to the accompanying drawings.

DETAILED DESCRIPTION OF THE EMBODIMENTS

Hereinafter, example embodiments of the present inventive concept will be described as follows with reference to the accompanying drawings.

Figure 1:
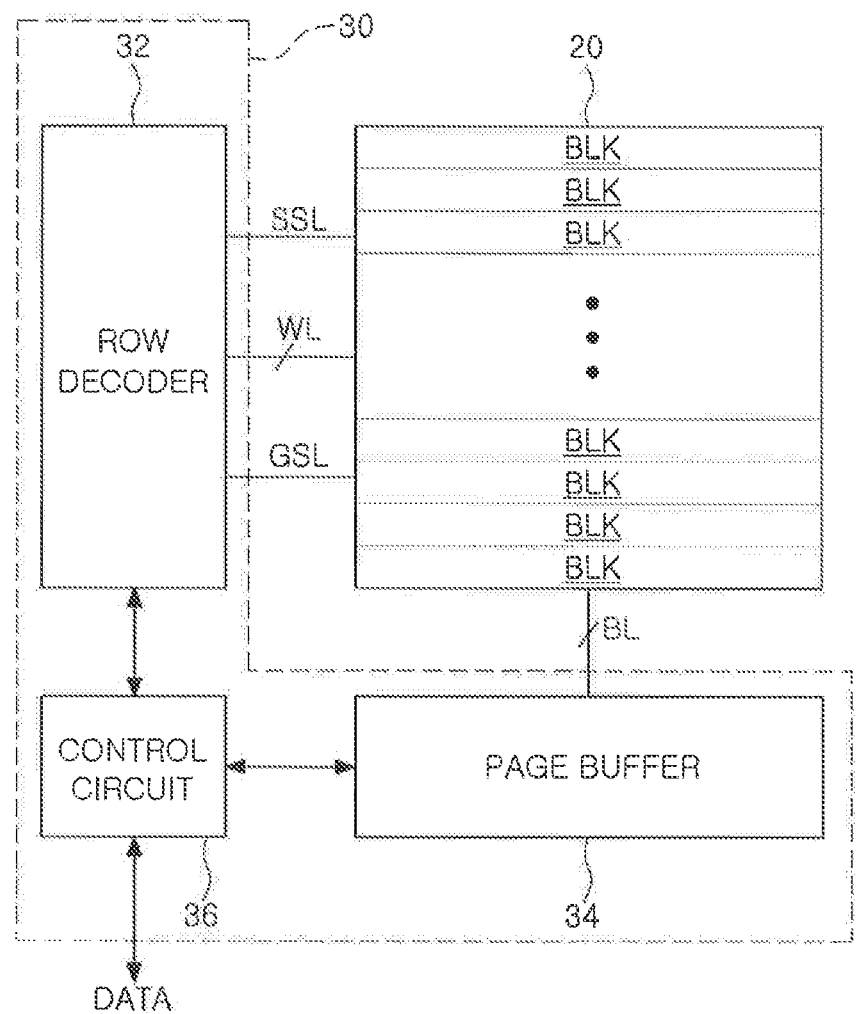
FIG. 1 is a schematic block diagram of a three-dimensional semiconductor memory device according to an exemplary embodiment of the present inventive concept.

FIG. 1 is a schematic block diagram of a three-dimensional semiconductor memory device according to an exemplary embodiment of the present invention.

Referring to FIG. 1, a three-dimensional semiconductor memory device 10 according to an exemplary embodiment of the present invention may include a memory cell array region 20 and a control logic region 30. The memory cell array region 20 may include a plurality of memory blocks BLK, and each memory block BLK may include a plurality of memory cells. The control logic region 30 may include a row decoder 32, a page buffer 34 and a control circuit 36.

The plurality of memory cells in the memory cell array region 20 may be connected to the row decoder 32 via a string select line SSL, a plurality of word lines WL and a ground select line GSL, and may be connected to the page buffer 34 via bit lines BL.

The row decoder 32 may decode an input address to generate and transmit driving signals of the word line WL. The row decoder 32 may respectively provide a word line voltage, which is generated by a voltage generation circuit in the control circuit 36, to a word line selected from the word lines WL and word lines WL not selected from the word lines WL, in response to a control signal of the control circuit 36.

The page buffer 34 may be connected to the memory cell array region 20 through the bit lines BL, to read information stored in the memory cells. The page buffer 34 may temporarily store data to be stored in the memory cells or may sense data having been stored in the memory cells, according to an operation mode. For example, the page buffer 34 may include a column decoder and a sense amplifier.

The column decoder may selectively activate the bit lines BL of the memory cell array region 20, and the sense amplifier may sense a voltage of the bit line BL selected by the column decoder during a reading operation, to read data stored in a selected memory cell. The control circuit 36 may control operations of the row decoder 32 and the page buffer 34. The control circuit 36 may receive an external control signal and an external voltage, and may operate in response to the received control signal. The control circuit 36 may include a voltage generating circuit generating voltages required for internal operations, for example, a programming voltage, a reading voltage, an erasing voltage and the like, using an external voltage. The control circuit 36 may control reading, writing and/or erasing operations in response to the control signals. Further, the control circuit 36 may include an input/output circuit. The input/output circuit may receive data (DATA) in a programming operation to transmit the received data to a page buffer 34, and may externally output the data (DATA) received from the page buffer 34 in a reading operation.

Figure 2:
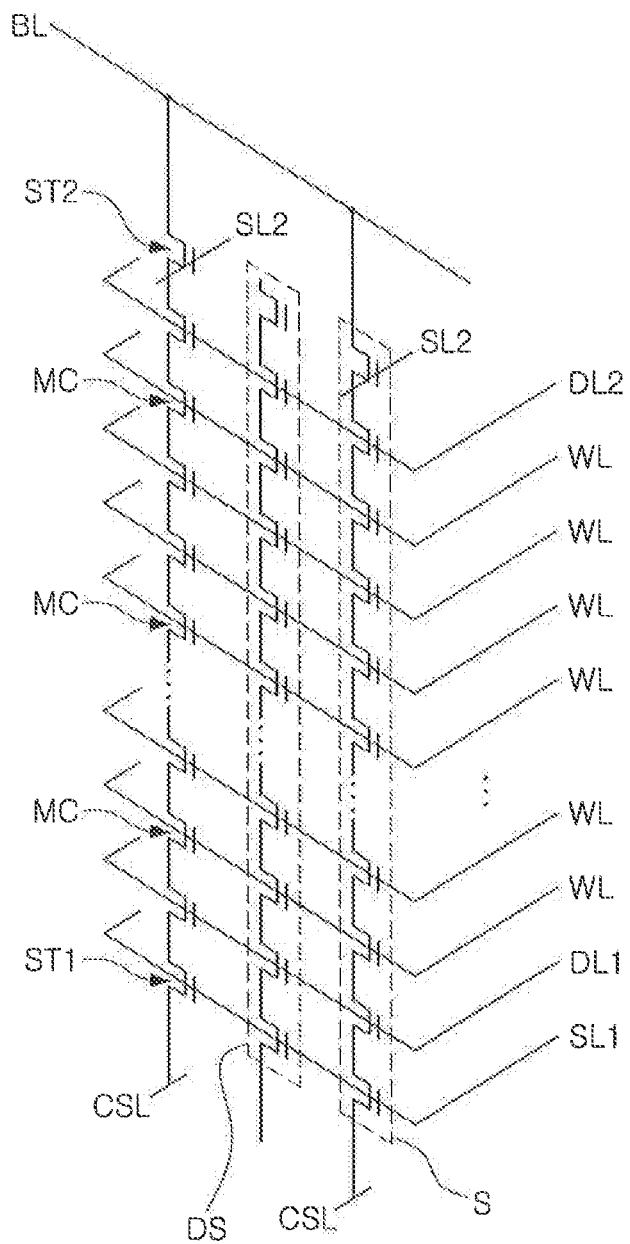
FIG. 2 is a circuit diagram illustrating a memory cell array region of a three-dimensional semiconductor memory device according to an exemplary embodiment of the present inventive concept.

Referring to FIG. 2, an example of a circuit of each of the memory blocks BLK of the memory cell array region (see, e.g., 20 of FIG. 1) of the three-dimensional semiconductor memory device (see, e.g., 10 of FIG. 1). FIG. 2 is a circuit diagram illustrating an example of the memory cell array region (see, e.g., 20 of FIG. 1).

Referring to FIG. 2, each of the memory blocks BLK of the memory cell array region 20 (see, e.g., FIG. 1) may include memory cells MC connected to each other in series, and a first select transistor ST1 and a second select transistor ST2, each connected to an end of the memory cells MC in series.

The first and second select transistors ST1 and ST2, and the memory cells MC between the first and second select transistors ST1 and ST2, may be memory strings S. Gate terminals of the memory cells MC connected to each other in series may be connected to word lines WL to select the memory cells MC, respectively.

A gate terminal of the first select transistor ST1 may be connected to a first select line SL1, and a source terminal thereof may be connected to a common source line CSL. A gate terminal of the second select transistor ST2 may be connected to a second select line SL2, and a source terminal thereof may be connected to a drain terminal of the memory cells MC.

For example, the first select transistor ST1 may be a ground select transistor, and the second select transistor ST2 may be a string select transistor. The first select line SL1 may be the ground select line in FIG. 1 (see, e.g., GSL of FIG. 1), and the second select line SL2 may be the string select line in FIG. 1 (see, e.g., SSL of FIG. 1).

Although FIG. 2 illustrates a structure in which one first select transistor ST1 and one second select transistor ST2 are connected to the memory cells MC a plurality of first select transistors ST1 and/or a plurality of second select transistors ST2 may be connected thereto.

For example, a first dummy line DL1 may be disposed between a lowermost word line among the word lines WL and the first select line SL1, and a second dummy line DL2 may be disposed between an uppermost word line WL among the word lines WL and the second select line SL2. The first dummy line DL1 may be a single or a plurality of dummy lines, and the second dummy line DL2 may be a single or a plurality of dummy lines.

A drain terminal of the second select transistor ST2 may be connected to the bit line BL. For example, when a signal is applied to the gate terminal of the second select transistor ST2 through the second select line SL2, a signal applied through the bit line BL may be transmitted to the memory cells MC and data reading and writing operations may be performed. Further, by applying a predetermined erasing voltage through the substrate, an erasing operation of erasing data recorded in the memory cells MC may be performed.

The three-dimensional semiconductor memory device according to an exemplary embodiment of the present inventive concept may include at least one dummy string DS. The dummy string DS may be a string including a dummy channel electrically separated from the bit line BL. For example, the dummy channel may be insulated from the bit line BL.

Figure 3:
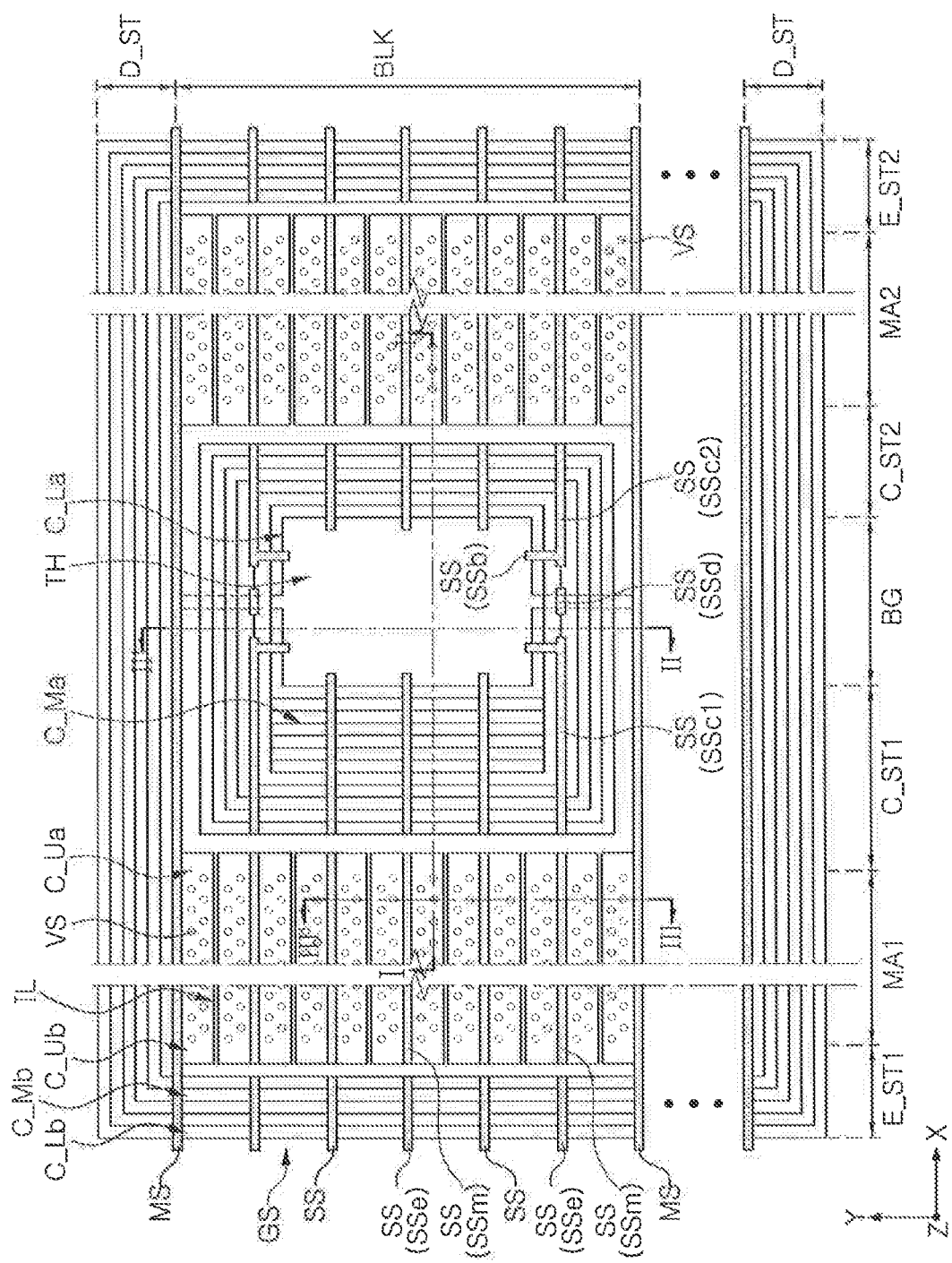
FIG. 3 is a plan view of a three-dimensional semiconductor memory device according to an exemplary embodiment of the present inventive concept.
Figure 4:
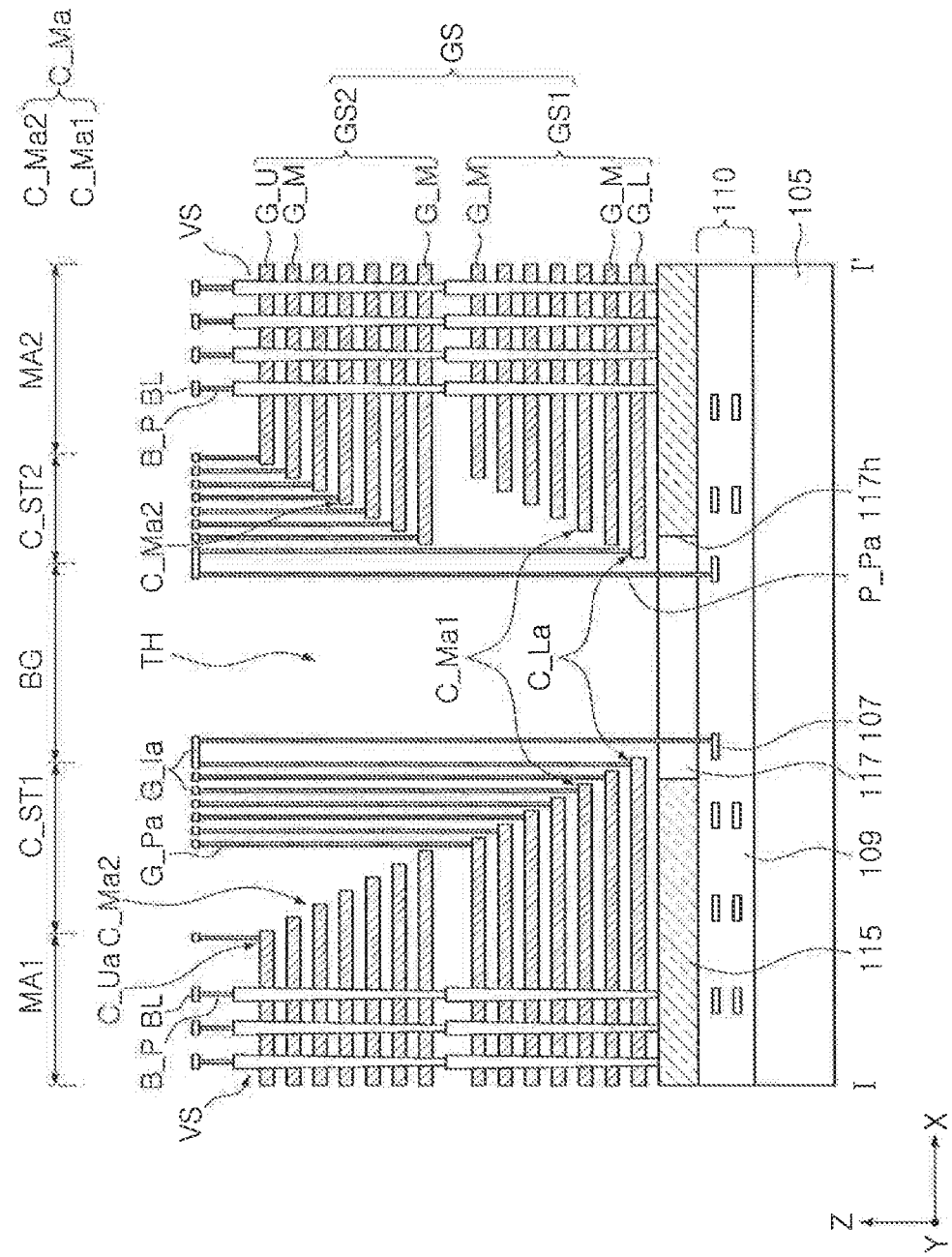
FIGS. 4, 5 and 6 are cross-sectional views of a three-dimensional semiconductor memory device according to an exemplary embodiment of the present inventive concept.
Figure 5:
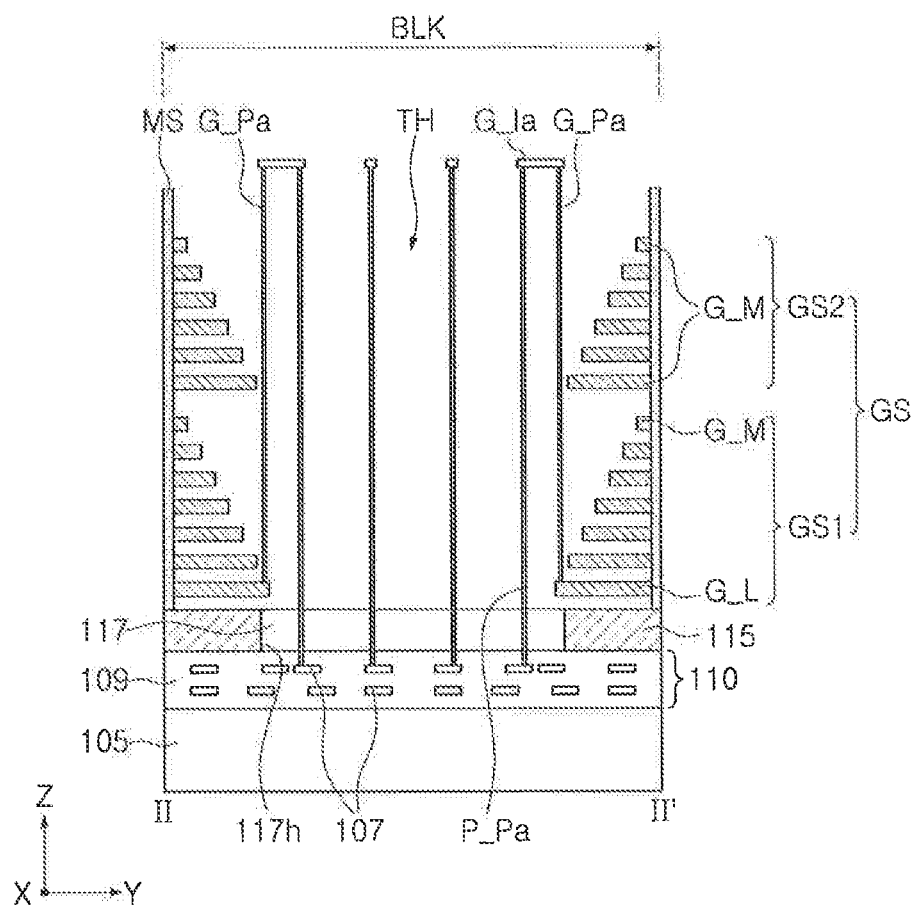
Figure 6:
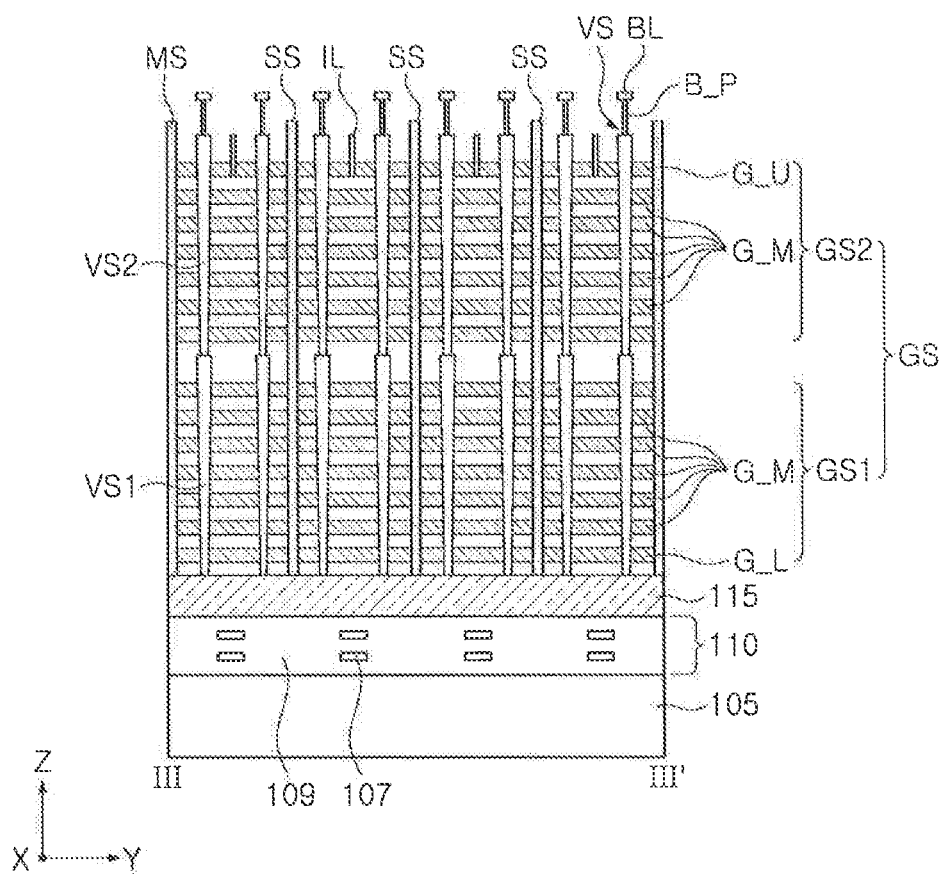

FIG. 3 is a plan view of a three-dimensional semiconductor memory device according to an exemplary embodiment of the present inventive concept, and FIGS. 4, 5 and 6 are cross-sectional views of a three-dimensional semiconductor memory device according to an exemplary embodiment of the present inventive concept. FIG. 4 is a cross-sectional view of a region taken along line I-I' of FIG. 3 according to an exemplary embodiment of the present inventive concept, FIG. 5 is a cross-sectional view of a region taken along line II-II' of FIG. 3 according to an exemplary embodiment of the present inventive concept, and FIG. 6 is a cross-sectional view of a region taken along line III-III' of FIG. 3 according to an exemplary embodiment of the present inventive concept.

Referring to FIGS. 3, 4, 5 and 6, a lower structure 110 including a peripheral circuit 107 may be disposed on a lower substrate 105. The lower substrate 105 may be, for example, a semiconductor substrate that may be formed of a semiconductor material such as, single crystal silicon or the like.

The peripheral circuit 107 may be a circuit that may be formed in the control logic region 30 described above with reference to FIG. 1. The peripheral circuit 107 may include peripheral wirings electrically connecting peripheral transistors, to constitute the peripheral transistors and circuits. The lower structure 110 may include the lower insulator 109 covering the peripheral circuit 107. For example, the lower insulator 109 may surround the peripheral circuit 107. The lower insulator 109 may be formed of an insulating material such as silicon oxide or the like.

A base substrate 115 may be disposed on the lower structure 110. The base substrate 115 may be a semiconductor substrate that may be formed of a semiconductor material such as, polysilicon or the like. For example, the base substrate 115 may be an upper substrate. For example, the base substrate 115 may be disposed above the lower substrate 105.

A gap-fill insulating layer 117 may be disposed in a hole 117*h* penetrating through the base substrate 115. The gap-fill insulating layer 117 may penetrate through at least a portion of the base substrate 115. The gap-fill insulating layer 117 may be formed of an insulating material such as silicon oxide or the like.

Memory cell array regions MA1 and MA2 may be sequentially arranged on the base substrate 115 in a first direction, for example, an X direction. The memory cell array regions MA1 and MA2 may include a first memory cell array region MA1 and a second memory cell array region MA2. Each of the first and second memory cell array regions MA1 and MA2 may correspond to the memory cell array region (see, e.g., 20 in FIG. 1).

A first inner stepped region C_ST1 and a second inner stepped region C_ST2 may be disposed between the first memory cell array region MA1 and the second memory cell array region MA2. A bridge region BG may be disposed between the first inner stepped region C_ST1 and the second inner stepped region C_ST2. A first outer stepped region E_ST1 may face the first inner stepped region C_ST1 with the first memory cell array region MA1 interposed therebetween. Thus, the first memory cell array region MA1 may be disposed between the first inner stepped region C_ST1 and the first outer stepped region E_ST1. A second outer stepped region E_ST2 may face the second inner stepped region C_ST2 with the second memory cell array region MA2 interposed therebetween. Thus, the second memory cell array region MA2 may be disposed between the second inner stepped region C_ST2 and the second outer stepped region E_ST2.

For example, the first outer stepped region E_ST1, the first inner stepped region C_ST1, the bridge region BG, the second inner stepped region C_ST2, and the second outer stepped region E_ST2 may be sequentially arranged in the first direction, the X direction.

Dummy stepped regions D_ST may be arranged in a second direction, for example, a Y direction, substantially perpendicular to the first direction, the X direction, on the plane, and may be disposed to face each other. For example, portions of the first and second memory cell array regions MA1 and MA2, the first outer stepped region E_ST1, the first inner stepped region C_ST1, the bridge region BG, the second inner stepped region C_ST2, and the second outer stepped region E_ST2 may be disposed between the dummy stepped regions D_ST.

A gate stack structure GS may be disposed in the plurality of memory cell array regions, for example, the first and second memory cell array regions MA1 and MA2, and may extend into the first and second outer stepped regions E_ST1 and E_ST2 and into the first and second inner stepped regions C_ST1 and C_ST2. The gate stack structure GS disposed in the first and second memory cell array regions MA1 and MA2 may be connected in the bridge region BG. For example, the gate stack structure GS may be connected to the peripheral circuit 107 in the bridge region BG. Penetration regions TH may be disposed in the bridge region BG, to penetrate through the gate stack structure GS. Each of the penetration regions TH may be surrounded by the gate stack structure GS. On the same plane, the penetration region TH may be surrounded by at least one intermediate gate electrode G_M, for example, one word line WL (see, e.g., FIG. 10). The penetration regions TH may overlap the gap-fill insulating layer 117. The gate stack disposed in the bridge region BG may be referred to as a bridge gate stack, for example, a bridge portion.

A width or length of the second inner stepped region C_ST2 in the first direction, the X direction, may be less than a width or length of the first inner stepped region C_ST1 in the first direction, the X direction. A length of the gate stack structure GS disposed in the second inner stepped region C_ST2 may be shorter than a length of the gate stack structure GS disposed in the first inner stepped region C_ST1, in the first direction, the X direction.

The gate stack structure GS may include a first gate stack structure GS1 and a second gate stack structure GS2, sequentially stacked on the base substrate 115 in a third direction, for example, a Z direction, substantially perpendicular to a surface of the base substrate 115. The gate stack structure GS may include gate electrodes G_L, G_M and G_U spaced apart from each other in the third direction, the Z direction, substantially perpendicular to a surface of the base substrate 115. The gate electrodes G_L, G_M and G_U may include a lower gate electrode G_L, intermediate gate electrodes G_M disposed on the lower gate electrode G_L, and an upper gate electrode G_U disposed on the intermediate gate electrodes G_M. The first gate stack structure GS1 may include the lower gate electrode G_L and the intermediate gate electrodes G_M spaced apart from each other in the third direction, the Z direction. The second gate stack structure GS2 may include the intermediate gate electrodes G_M and upper gate electrode G_U spaced apart from each other in the third direction, the Z direction.

The gate electrodes G_L, G_M and G_U may be formed of a conductive material including at least one of, for example, doped polysilicon, metal nitride such as titanium nitride or the like, and a metal such as tungsten or the like.

For example, the upper gate electrode G_U may be provided as a plurality of gate electrodes spaced apart from each other in the third direction, the Z direction. The upper gate electrodes G_U may face each and may be spaced apart from each other in the first direction, the X direction with the penetration region TH interposed therebetween. The upper gate electrodes G_U may be disposed in the first and second memory cell array regions MA1 and MA2 and may not be connected to each other in the bridge region BG. The intermediate gate electrodes G_M and the lower gate electrodes G_L may be disposed to surround the penetration region TH. The intermediate gate electrodes G_M disposed in the first and second memory cell array regions MA1 and MA2 may be connected to each other in the bridge region BG. The lower gate electrodes G_L disposed in the first and second memory cell array regions MA1 and MA2 may not be connected to each other in the bridge region BG, and may be spaced apart from each other in the first direction, the X direction.

The lower gate electrode G_L may be the first select line SL1 as described above with reference to FIG. 2, and the upper gate electrode G_U may be the second select line SL2 described above with reference to FIG. 2. The intermediate gate electrodes G_M may be the word lines WL as described above with reference to FIG. 2. Thus, the intermediate gate electrodes G_M may correspond to the description of the word lines WL.

Main isolation structures MS may be disposed to extend in the first direction, the X direction. The main isolation structures MS may pass through the gate stack structure GS in the third direction, the Z direction, to contact the base substrate 115. The main isolation structures MS may extend parallel to each other from a plan view, and may divide the gate stack structure GS in the second direction, the Y direction. The main isolation structures MS may divide the first gate stack structure GS1 and the second gate stack structure GS2 in the second direction, the Y direction. The gate stack structure GS may have a linear shape extending in the first direction, the X direction, and may be divided by the main isolation structures MS in the second direction, the Y direction.

The penetration regions TH may be disposed between the main isolation structures MS.

In each of the first and second memory cell array regions MA1 and MA2, a memory block BLK as described above with reference to FIG. 1 may be disposed between adjacent main isolation structures MS. The main isolation structures MS may separate the memory blocks BLK from each other. One penetration region TH may be disposed for each memory block BLK. For example, each memory block BLK may include a penetration region TH.

Five auxiliary isolation structures SS may be disposed between the main isolation structures MS. The auxiliary isolation structures SS may also pass through the gate stack structure GS in the third direction, the Z direction, to contact the base substrate 115. The auxiliary isolation structures SS may include a plurality of portions arranged sequentially in the first direction, the X direction. For example, the auxiliary isolation structures SS may include cell separation portions SSm traversing the first and second memory cell array regions MA1 and MA2 in the first direction, edge separation portions SSe disposed in the first and second outer stepped regions E_ST1 and E_ST2 and having ends facing ends of the cell separation portions SSm while being spaced apart therefrom, and intermediate separation portions SSc1 and SSc2 disposed in the first and second inner stepped regions C_ST1 and C_ST2 and having ends facing ends of the cell separation portions SSm to be spaced apart therefrom. The intermediate separation portions SSc1 and SSc2 may include a first intermediate separation portion SSc1 disposed in the first inner stepped region C_ST1 and a second intermediate separation portion SSc2 disposed in the second inner stepped region C_ST2. A width of the second inner stepped region C_ST2 may be less than a width of the first inner stepped region C_ST1, in the first direction, the X direction. A length of the second intermediate separation portion SSc2 may be less than a length of the first intermediate separation portion SSc1, in the first direction, the X direction. A portion of the auxiliary isolation structures SS, adjacent or nearest to the main isolation structure MS, may include branch separation portions SSb extending from the first and second intermediate separation portions SSc1 and SSc2 in the second direction, the Y direction, and a dummy separation portion SSd disposed between the first and second intermediate separation portions SSc1 and SSc2, in the bridge region BG. The branch separation portions SSb may extend toward the penetration region TH. For example, the branch separation portions SSb may extend into a penetration region TH.

A plurality of the upper gate electrodes G_U spaced apart from each other in the second direction, the Y direction, may be disposed between a pair of main isolation structures MS facing each other. For example, between a pair of main isolation structures MS facing each other, five auxiliary isolation structures SS may be disposed between the pair of main isolation structures MS in a single memory block BLK, and for example, at least one insulating line IL may be disposed between the auxiliary isolation structures SS and between the main isolation structure MS and the auxiliary isolation structure SS. For example, between each pair of auxiliary isolation structures SS, an insulating line IL may be disposed, and between each main isolation structure MS and auxiliary isolation structure SS, an insulating line IL may be disposed. In addition, the plurality of upper gate electrodes G_U may be separated from each other by the plurality of auxiliary isolation structures SS and insulating lines IL. For example, between one pair of main isolation structures MS facing each other, twelve upper gate electrodes G_U may be disposed to be separated from each other by five auxiliary isolation structures SS and six insulating lines IL in a single memory block BLK. In this case, the insulating line IL may be disposed on the intermediate gate electrodes G_M.

For example, a plurality of the lower gate electrodes G_L may be disposed to be spaced apart from each other in the second direction, the Y direction, between a pair of main isolation structures MS facing each other. In addition, the plurality of lower gate electrodes G_U may be separated from each other by the plurality of auxiliary isolation structures SS. For example, six lower gate electrodes G_L may be disposed to be separated from each other by five auxiliary isolation structures SS in one memory block BLK, between a pair of main isolation structures MS facing each other. One lower gate electrode G_L may be disposed for two of the upper gate electrodes G_U separated by the insulating line IL. For example, two upper gate electrodes G_U separated by the insulating line IL may overlap a lower gate electrode G_L.

The gate stack structure GS may have gate contact pads C_Ua, C_Ub, C_Ma, C_Mb, C_La and C_Lb.

The gate contact pads may include inner and outer upper contact pads C_Ua and C_Ub of the upper gate electrode G_U, and inner and outer intermediate contact pads C_Ma and C_Mb of the intermediate gate electrodes G_M, and inner and outer lower contact pads C_La and C_Lb of the lower gate electrode G_L. For example, the upper gate electrode G_U may include the inner upper contact pad C_Ua located in the first and second inner stepped regions C_ST1 and C_ST2, and the outer upper contact pad C_Ub located in the outer stepped regions E_ST1 and E_ST2. For example, the intermediate gate electrodes G_M may include the inner intermediate contact pads C_Ma located in the first and second inner stepped regions C_ST1 and C_ST2, and the outer intermediate contact pads C_Mb located in the first and second outer stepped regions E_ST1 and E_ST2. For example, lower gate electrode G_L may include the inner lower contact pad C_La located in the first and second inner stepped regions C_ST1 and C_ST2 and in the bridge region BG, and the outer lower contact pad C_Lb located in the first and second outer stepped regions E_ST1 and E_ST2.

The inner lower contact pad C_La, the inner intermediate contact pads C_Ma, and the inner upper contact pad C_Ua may form intermediate steps lowered in a direction toward the penetration region TH. For example, intermediate steps, which may be formed by the inner lower contact pad C_La, the inner intermediate contact pads C_Ma, and the inner upper contact pad C_Ua, may include steps lowered in the first direction, the X direction, and steps lowered in the second direction, the Y direction.

The intermediate gate electrodes G_M of the first gate stack structure GS1 may include first intermediate contact pads C_Ma1, arranged in a stepped shape lowered toward the penetration region TH, while surrounding the penetration region TH. The intermediate gate electrodes G_M of the second gate stack structure GS2 may include second intermediate contact pads C_Ma2, arranged in a stepped shape lowered toward the penetration region TH, while surrounding the penetration region TH. The second intermediate contact pads C_Ma2 may cover a portion of the first intermediate contact pads C_Ma1. For example, in the second inner step region C_ST2, the second intermediate contact pads C_Ma2 may cover the first intermediate contact pads C_Ma1.

The inner intermediate contact pads C_Ma may be formed by the first and second intermediate contact pads C_Ma1 and C_Ma2 stacked on the base substrate 115.

Portions of the auxiliary isolation structures SS, for example, a first intermediate separation portion SSc1 disposed in the first inner stepped region C_ST1 and a second intermediate separation portion SSc2 disposed in the second inner stepped region C_ST2 may pass through the first and second intermediate contact pads C_Ma1 and C_Ma2.

Edge steps, which may be constituted by the outer lower contact pad C_Lb, the outer intermediate contact pads C_Mb and the outer upper contact pad C_Ub, may include steps that may be lowered in a direction away from the first and second memory cell array regions MA1 and MA2, for example, in the X direction.

Vertical channel structures VS may be disposed in the first and second memory cell array regions MA1 and MA2. The vertical channel structures VS may be disposed on the base substrate 115, and may penetrate through the gate stack structure GS. The vertical channel structures VS may include a first vertical channel structure VS1 and a second vertical channel structure VS2 stacked on the base substrate 115. The first vertical channel structure VS1 may penetrate through the first gate stack structure GS1, and the second vertical channel structure VS2 may penetrate through the second gate stack structure GS2. A lower end of the first vertical channel structure VS1 may be disposed on the base substrate 115. A lower end of the second vertical channel structure VS2 may be disposed on an upper end of the first vertical channel structure VS1. Bit lines BL as described above with reference to FIGS. 1 and 2 may be disposed on the vertical channel structures VS. Bit line contact plugs B_P may be disposed between the bit lines BL and the vertical channel structures VS.

The gate stack structure GS may be electrically connected to the peripheral circuit 107 in the lower structure 110.

Gate contact plugs G_Pa may be disposed on the gate contact pads C_Ua, C_Ub, C_Ma, C_Mb, C_La and C_Lb of the gate stack structure GS. Peripheral contact plugs P_Pa may be disposed on the peripheral circuit 107.

The peripheral contact plugs P_Pa may pass through the gap-fill insulating layer 117 and the penetration region TH, to be electrically connected to the peripheral circuit 107.

Gate connection wirings G_Ia may be disposed to electrically connect the gate contact plugs G_Pa and the peripheral contact plugs P_Pa to each other.

The gate electrodes G_L, G_M and G_U of the gate stack structure GS may be electrically connected to the peripheral circuit 107 by the gate contact plugs G_Pa, the peripheral contact plugs P_Pa and the gate connection wirings G_Ia.

For example, at least a portion of the gate electrodes G_L, G_M and G_U of the gate stack structure GS may be electrically connected to the peripheral circuit 107 through the first and second inner stepped regions C_ST1 and C_ST2.

In the first and second inner stepped regions C_ST1 and C_ST2 and the bridge region BG, a first plurality of the gate contact plugs G_Pa may be disposed on the gate contact pads C_Ma and C_La of the first gate stack structure GS1, and a second plurality of the gate contact plugs G_Pa may be disposed on the gate contact pads C_Ua and C_Ma of the second gate stack structure GS2.

For example, a portion of the gate electrodes G_L, G_M and G_U of the gate stack structure GS may be electrically connected to the peripheral circuit 107 through the first and second outer stepped regions E_ST1 and E_ST2.

For example, at least portions of the intermediate gate electrodes G_M and the lower gate electrode G_L may be electrically connected to the peripheral circuit 107 by a gate contact plug G_Pa disposed on the inner intermediate contact pad C_Ma, a peripheral contact plug P_Pa electrically connected to the peripheral circuit 107, while passing through the penetration region TH, and a gate connection wiring G_Ia electrically connecting the gate contact plug G_Pa and the peripheral contact plug P_Pa to each other. In the first and second inner stepped regions C_ST1 and C_ST2, the inner intermediate contact pad C_Ma may include first intermediate contact pads C_Ma1 arranged in a stepped shape by the word lines of the first gate stack structure GS1, and second intermediate contact pads C_Ma2 arranged in a stepped shape by the word lines of the second gate stack structure GS2. The second intermediate contact pads C_Ma2 may be disposed to overlap the first intermediate contact pads C_Ma1, at least in the second inner stepped region C_ST2. The second intermediate contact pads C_Ma2 may be disposed to overlap the first intermediate contact pads C_Ma1 in the bridge region BG. The second intermediate contact pads C_Ma2 may be spaced apart from the first contact pads C_Ma1 in the first direction, the X direction, in the first inner stepped region C_ST1. In an exemplary embodiment of the present inventive concept, the second intermediate contact pads C_Ma2 may be spaced apart from the first contact pads C_Ma1 in the third direction, the Z direction.

For example, a first plurality of the gate contact plugs G_Pa may be disposed on the second intermediate contact pads C_Ma2 in the second inner stepped region C_ST2, and a second plurality of the gate contact plugs G_Pa may be disposed on the first intermediate contact pads C_Ma1, not overlapped with the second intermediate contact pads C_Ma2, in the first inner stepped region C_ST1.

Figure 7:
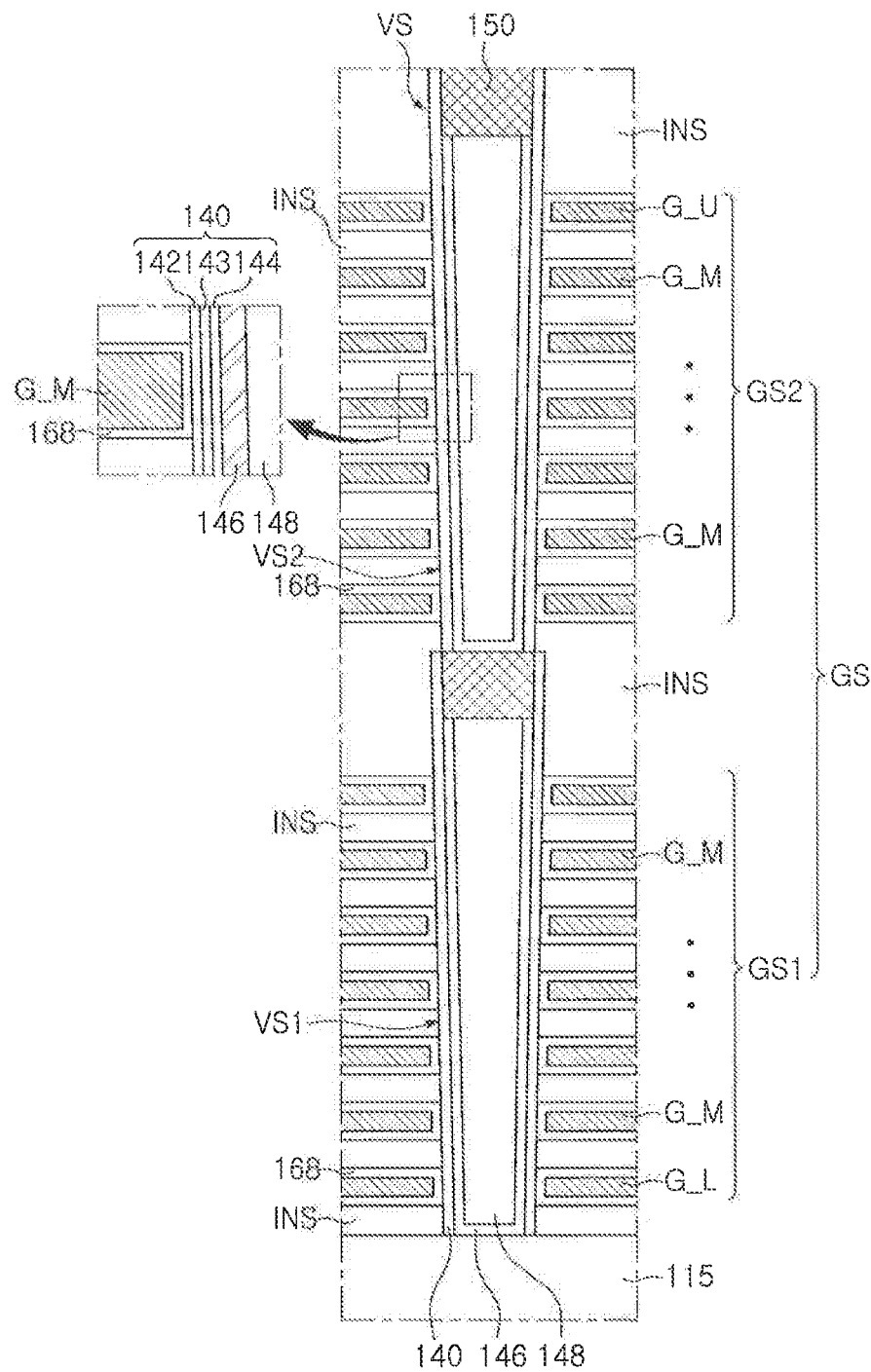
FIGS. 7 and 8 are cross-sectional views illustrating portions of a three-dimensional semiconductor memory device according to an exemplary embodiment of the present inventive concept.

FIG. 7 is a cross-sectional view of the vertical channel structures VS as described above with reference to FIGS. 3 to 6.

Referring to FIG. 7 with reference to FIGS. 3 to 6, the gate stack structure GS may include the gate electrodes G_L, G_M and G_U disposed on the base substrate 115, as described above. The gate stack structure GS may include the first gate stack structure GS1 and the second gate stack structure GS2.

Each of the vertical channel structures VS may penetrate through the gate stack structure GS. The vertical channel structures VS may include the first vertical channel structure VS1 passing through the first gate stack structure GS1 and the second vertical channel structure VS2 passing through the second gate stack structure GS2.

The first vertical channel structure VS1 may include an insulating core layer 148 extending in a direction perpendicular to the surface of the base substrate 115 and penetrating through the first gate stack structure GS1. The first vertical channel structure VS1 may further include a channel semiconductor layer 146 covering a side surface and a bottom surface of the insulating core layer 148, a first gate dielectric 140 surrounding an external side of the channel semiconductor layer 146, and a pad layer 150 disposed on the insulating core layer 148 to be electrically connected to the channel semiconductor layer 146. The second vertical channel structure VS2 may include an insulating core layer 148 extending in a direction perpendicular to the surface of the base substrate 115 and penetrating through the second gate stack structure GS2. The second vertical channel structure VS2 may further include a channel semiconductor layer 146 covering a side surface and a bottom surface of the insulating core layer 148, a first gate dielectric 140 surrounding an external side of the channel semiconductor layer 146, and a pad layer 150 disposed on the insulating core layer 148 and electrically connected to the channel semiconductor layer 146.

The channel semiconductor layer 146 of the first vertical channel structure VS1 may contact the base substrate 115, and the channel semiconductor layer 146 of the second vertical channel structure VS2 may contact the pad layer 150 of the first vertical channel structure VS1.

An insulating material INS may be disposed on upper and lower portions of the gate stack structure GS and between the gate electrodes G_L, G_M and G_U. For example, the insulating material INS may be disposed between the first gate stack structure GS1 and the second gate stack structure GS2. The insulating material INS may be, for example, silicon oxide. The vertical channel structures VS may pass through the insulating material INS while penetrating through the gate stack structure GS.

For example, a second gate dielectric 168 may be disposed between the gate electrodes G_L, G_M and G_U and between the vertical channel structures VS, and may extend between the gate electrodes G_L, G_M and G_U and the insulating material INS. For example, the second gate dielectric 168 may cover a side surface, and upper and lower surfaces of the gate electrodes G_L, G_M and G_U.

The channel semiconductor layer 146 may be electrically connected to the base substrate 115. The channel semiconductor layer 146 may be formed of a semiconductor material such as silicon or the like. The pad layer 150 may be formed of a doped polysilicon having an N-type conductivity. The insulating core layer 148 may be formed of an insulating material such as silicon oxide or the like.

The first gate dielectric 140 may include a tunnel dielectric 144, an information storage layer 143, and a blocking dielectric 142. The information storage layer 143 may be disposed between the tunnel dielectric 144 and the blocking dielectric 142. The tunnel dielectric 144 may be disposed to be adjacent to the channel semiconductor layer 146, and the blocking dielectric 142 may be disposed to be adjacent to the gate electrodes G_L, G_M and G_U. For example, the tunnel dielectric 144 may be disposed between the channel semiconductor layer 146 and the information storage layer 143, and the blocking dielectric 142 may be disposed between the gate electrodes G_L, G_M and G_U and the information storage layer 143.

The tunnel dielectric 144 may include, for example, silicon oxide and/or impurity-doped silicon oxide. The blocking dielectric 142 may include, for example, silicon oxide and/or a high-k dielectric. The information storage layer 143 may be a layer between the channel semiconductor layer 146 and the intermediate gate electrodes G_M, to store information. The information storage layer 143 may be formed of a material, for example, silicon nitride, capable of trapping electrons injected from the channel semiconductor layer 146 through the tunnel dielectric 144. The second gate dielectric 168 may include a high-k dielectric, such as aluminum oxide (AlO) or the like.

The information storage layer 143 may store information in regions thereof, facing the intermediate gate electrodes G_M, which may correspond to the word lines WL (see, e.g., FIGS. 1 and 2) described above with reference to FIGS. 1 and 2, in the gate stack structure GS. The regions of the information storage layer 143, in which information may be stored, in the vertical channel structure VS, may be extend in a direction perpendicular to the surface of the base substrate 115, and may constitute the memory cells MC described above with reference to FIG. 2.

The channel semiconductor layer 146 may be directly connected to the base substrate 115, but an exemplary embodiment of the present inventive concept thereof is not limited thereto.

Figure 8:
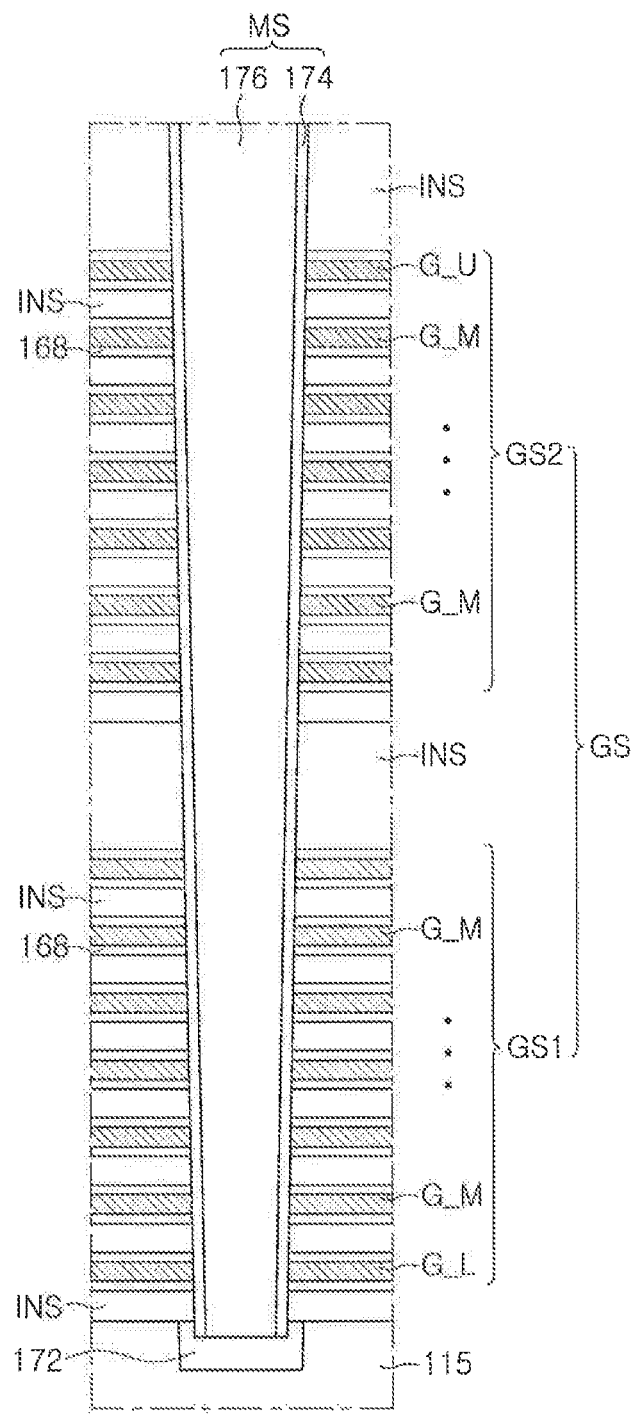

FIG. 8 is a cross-sectional view of the main isolation structure MS as described above with reference to FIGS. 3 to 6.

Referring to FIG. 8 with reference to FIGS. 3 to 6, the gate stack structure GS may include the gate electrodes G_L, G_M and G_U, as described above with reference to FIGS. 3 to 6, and the main isolation structures MS may pass through the gate electrodes G_L, G_M and G_U of the gate stack structure GS.

An insulating material INS may be disposed on the upper and lower portions of the gate stack structure GS and between the gate electrodes G_L, G_M and G_U. For example, the insulating material INS may be disposed between the first gate stack structure GS1 and the second gate stack structure GS2. The main isolation structures MS may penetrate through the gate electrodes G_L, G_M and G_U of the gate stack structure GS and the insulating material INS. A second gate dielectric 168 may be disposed to extend between the gate electrodes G_L, G_M G_U and the insulating material INS. For example, the second gate dielectric 168 may cover an upper surface and a lower surface of the gate electrodes G_L, G_M and G_U.

Each of the main isolation structures MS may include a conductive pattern 176 and a spacer 174 covering a side surface of the conductive pattern 176. The spacer 174 may be formed of an insulating material such as silicon oxide, silicon nitride or the like. The spacer 174 may separate the conductive pattern 176 from the gate stack structure GS. The conductive pattern 176 may be formed of a conductive material including at least one of, for example, doped polysilicon, a metal nitride such as titanium nitride or the like, or a metal such as tungsten or the like. For example, the auxiliary isolation structures SS (see, e.g., FIGS. 3 to 6) may be formed of the same material as that of the main isolation structures MS and may have the same structure as that of the main isolation structures MS.

An impurity region 172 may be disposed in the base substrate 115 below the main isolation structures MS. The impurity region 172 may be an N-type conductivity region, and a portion of the base substrate 115 adjacent to the impurity region 172 may be a P-type conductivity region. The impurity region 172 may be the common source line CSL (see, e.g., FIGS. 1 and 2) described above with reference to FIGS. 1 and 2.

Figure 9:
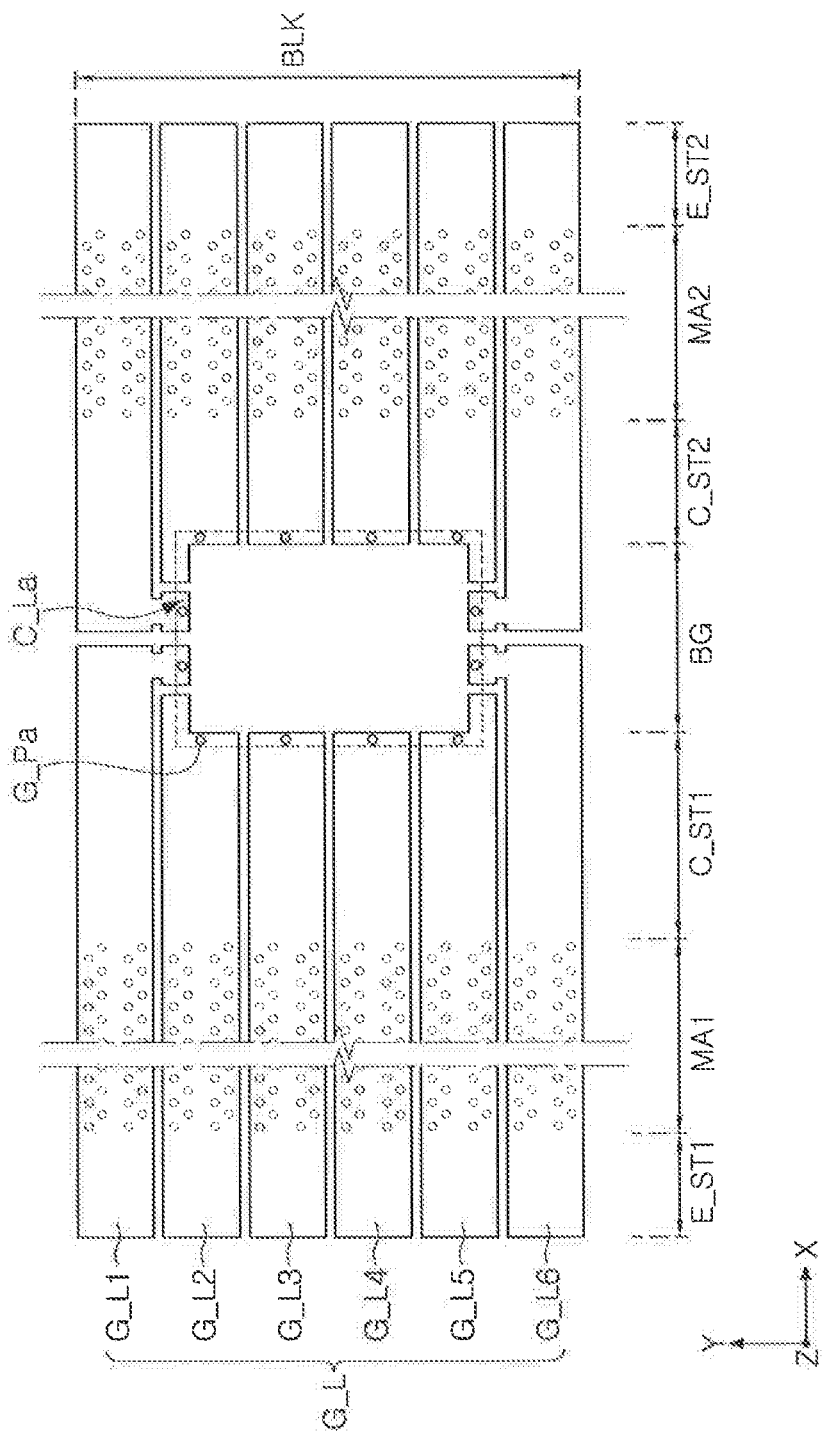
FIGS. 9 and 10 are plan views illustrating portions of gate electrodes of a three-dimensional semiconductor memory device according to an exemplary embodiment of the present inventive concept.
Figure 10:
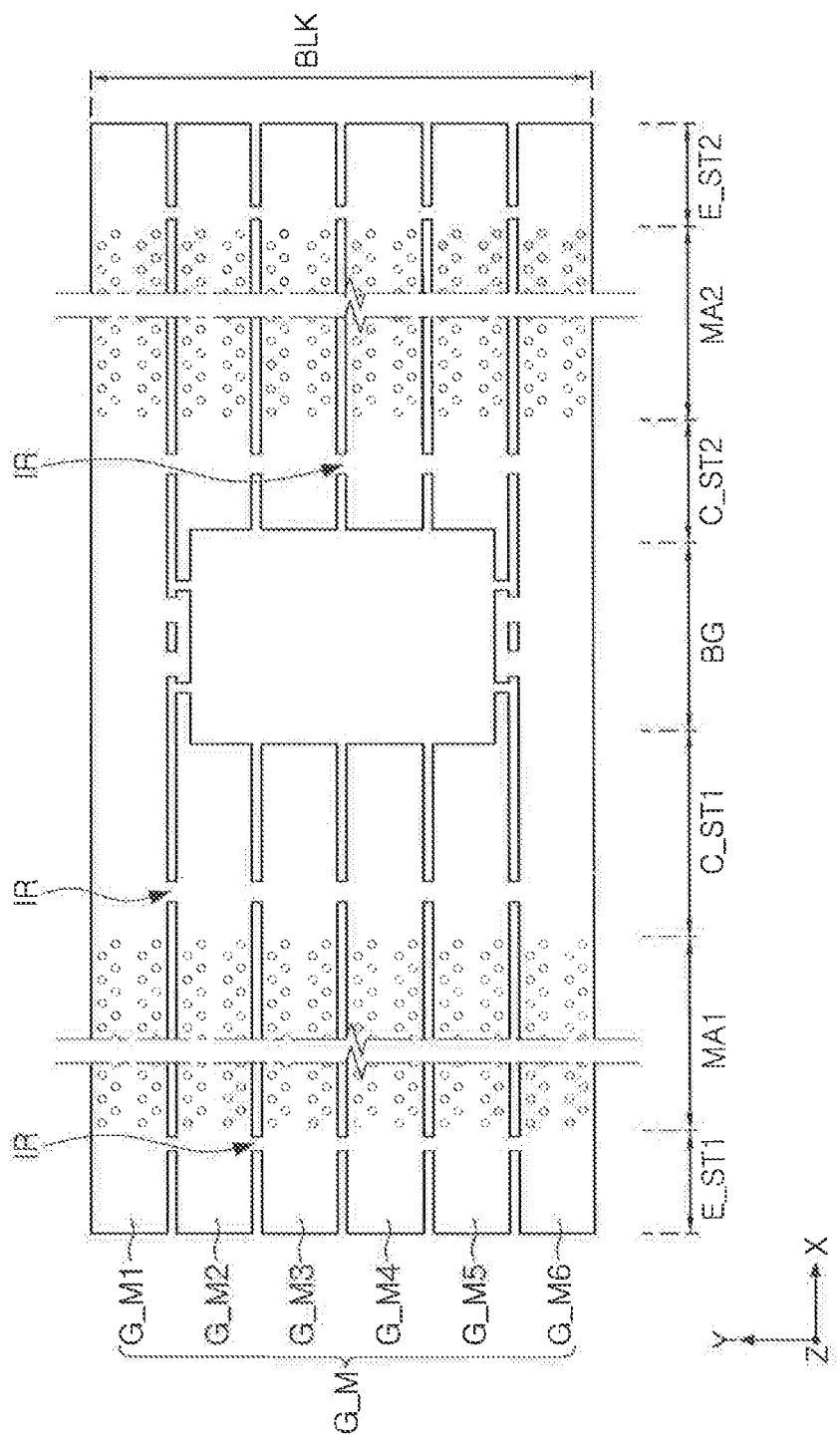

FIGS. 9 and 10 are plan views illustrating gate electrodes of a three-dimensional semiconductor memory device according to an exemplary embodiment of the present inventive concept. FIG. 9 illustrates lower gate electrodes G_L disposed in a single memory block BLK according to an exemplary embodiment of the present inventive concept, and FIG. 10 illustrates intermediate gate electrodes G_M nearest to the lower gate electrodes G_L disposed in a single memory block BLK.

Referring to FIG. 9, the lower gate electrodes G_L may be disposed at the first and second memory cell array regions MA1 and MA2, and may extend to the inner stepped regions C_ST1 and C_ST2. A portion of the lower gate electrodes G_L may extend further into the bridge region BG. The lower gate electrodes G_L extending from the first and second memory cell array regions MA1 and MA2 may not be connected to each other in the bridge region BG to be spaced apart from each other in the first direction, the X direction. The lower gate electrodes G_L may include six lower gate electrodes G_L1, G_L2, G_L3, G_L4, G_L5 and G_L6 spaced apart from each other in the second direction, the Y direction, on the same plane. First to sixth lower gate electrodes G_L1, G_L2, G_L3, G_L4, G_L5 and G_L6 may be electrically insulated from each other. Ends of the first to sixth lower gate electrodes G_L1, G_L2, G_L3, G_L4, G_L5 and G_L6 may include inner lower contact pads C_La disposed around the penetration region TH. For example, the inner lower contact pads C_La may extend from ends of the first to sixth lower gate electrodes G_L1, G_L2, G_L3, G_L4, G_L5 and G_L6. Gate contact plugs G_Pa may be disposed on the inner lower contact pads C_La.

A portion of the first to sixth lower gate electrodes G_L1, G_L2, G_L3, G_L4, G_L5 and G_L6 may have a shape extending toward the penetration region TH (see, e.g., FIG. 3). The first and sixth lower gate electrodes G_L1 and G_L6 may be adjacent to the main isolation structure MS (see, e.g., FIG. 3). Each of the first and sixth lower gate electrodes G_L1 and G_L6 may include an extended portion bent in the second direction, the Y direction, in the bridge region BG, and the inner lower contact pad C_La may be disposed on the extended portion to provide the inner lower contact pad C_La. The extended portion may extend toward the penetration region TH (see, e.g., FIG. 3). The extended portion may include a region having a relatively narrow width. For example, the extended portion may extend to have a constant width. In another example, the extended portion may have a varying width.

A second lower gate electrode G_L2 and a fifth lower gate electrode G_L5 may each include an end, adjacent to the penetration region TH, with a protruding portion extending adjacent to the penetration region TH, and the protruding portion has a width less than the width of the second lower gate electrode G_L2 and the fifth lower gate electrode G_L5. For example, the end adjacent to the penetration TH, of the second and fifth lower gate electrodes G_L2 and G_L5, may have a stepped shape.

Referring to FIG. 10, intermediate gate electrodes G_M may be disposed at the first and second memory cell array regions MA1 and MA2, and may extend to the inner stepped regions C_ST1 and C_ST2 and the bridge regions BG. The intermediate gate electrodes G_M may be connected to each other in the bridge region BG. For example, on the same plane, the penetration region TH (see FIG. 3) may be surrounded by one intermediate gate electrode G_M, for example, one word line WL.

In an exemplary embodiment of the present inventive concept, the intermediate gate electrodes G_M may be connected to each other.

The intermediate gate electrode G_M may include six sub-intermediate gate electrodes G_M1, G_M2, G_M3, G_M4, G_M5 and G_M6 spaced apart from each other in the second direction, the Y direction, on the same plane. First to sixth sub-intermediate gate electrodes G_M1, G_M2, G_M3, G_M4, G_M5 and G_M6 may be electrically connected to each other by connection portions IR. For example, the connection portions IR may connect the first to sixth sub-intermediate gate electrodes G_M1, G_M2, G_M3, G_M4, G_M5 and G_M6 to each other in the inner stepped regions C_ST1 and C_ST2 and the outer step regions E_ST1 and E_ST2.

The first sub-intermediate gate electrode G_M and the sixth sub-intermediate gate electrode G_M6 may be adjacent to the main isolation structure MS (see, e.g., FIG. 3). The first sub-intermediate gate electrode G_M1 and the sixth sub-intermediate gate electrode G_M6 may extend from the first and second memory cell array regions MA1 and MA2 to the bridge region BG, while having a substantially constant width, respectively. For example, an extension portion may be extending from a long side of the first sub-intermediate gate electrode G_M1 toward the penetration region TH, and an extension portion may be extending from a long side of the sixth sub-intermediate gate electrode G_M6 toward the penetration region TH. For example, the extension portion of the first sub-intermediate gate electrode G_M1 may face the extension portion of the sixth sub-intermediate gate electrode G_M6.

The second sub-intermediate gate electrode G_M2 and the fifth sub-intermediate gate electrode G_M5 may have a disconnected portion in the bridge region BG.

In an exemplary embodiment of the present inventive concept, each of the second sub-intermediate gate electrode G_M2 and the fifth sub-intermediate gate electrode G_M5 may include an end, adjacent to the penetration region TH, with a protruding portion extending adjacent to the penetration region TH, and the protruding portion has a width less than the width of the second sub-intermediate gate electrode G_M2 and the fifth sub-intermediate gate electrode G_M5. For example, the end adjacent to the penetration TH, of the second and fifth intermediate gate electrodes G_M2 and G_M5, may have a stepped shape. For example, the end, adjacent to the penetration region TH, of the second sub-intermediate gate electrode G_M2 may not be connected to the first sub-intermediate gate electrode G_M1, and the end, adjacent to the penetration region TH, of the fifth sub-intermediate gate electrode G_M5 may not be connected to the sixth sub-intermediate gate electrode G_M6.

Figure 11:
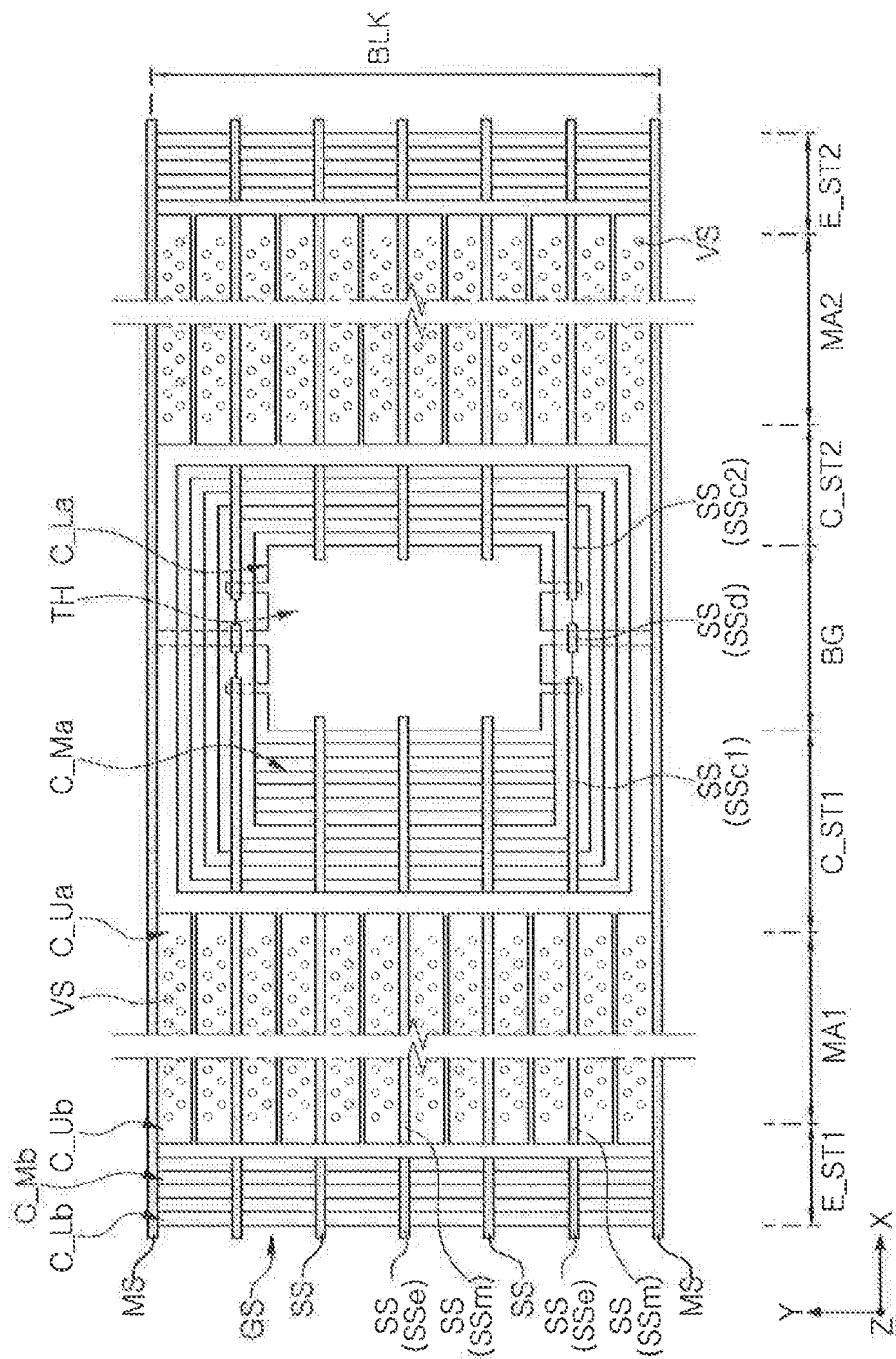
FIG. 11 is a plan view of a three-dimensional semiconductor memory device according to an exemplary embodiment of the present inventive concept.
Figure 12:
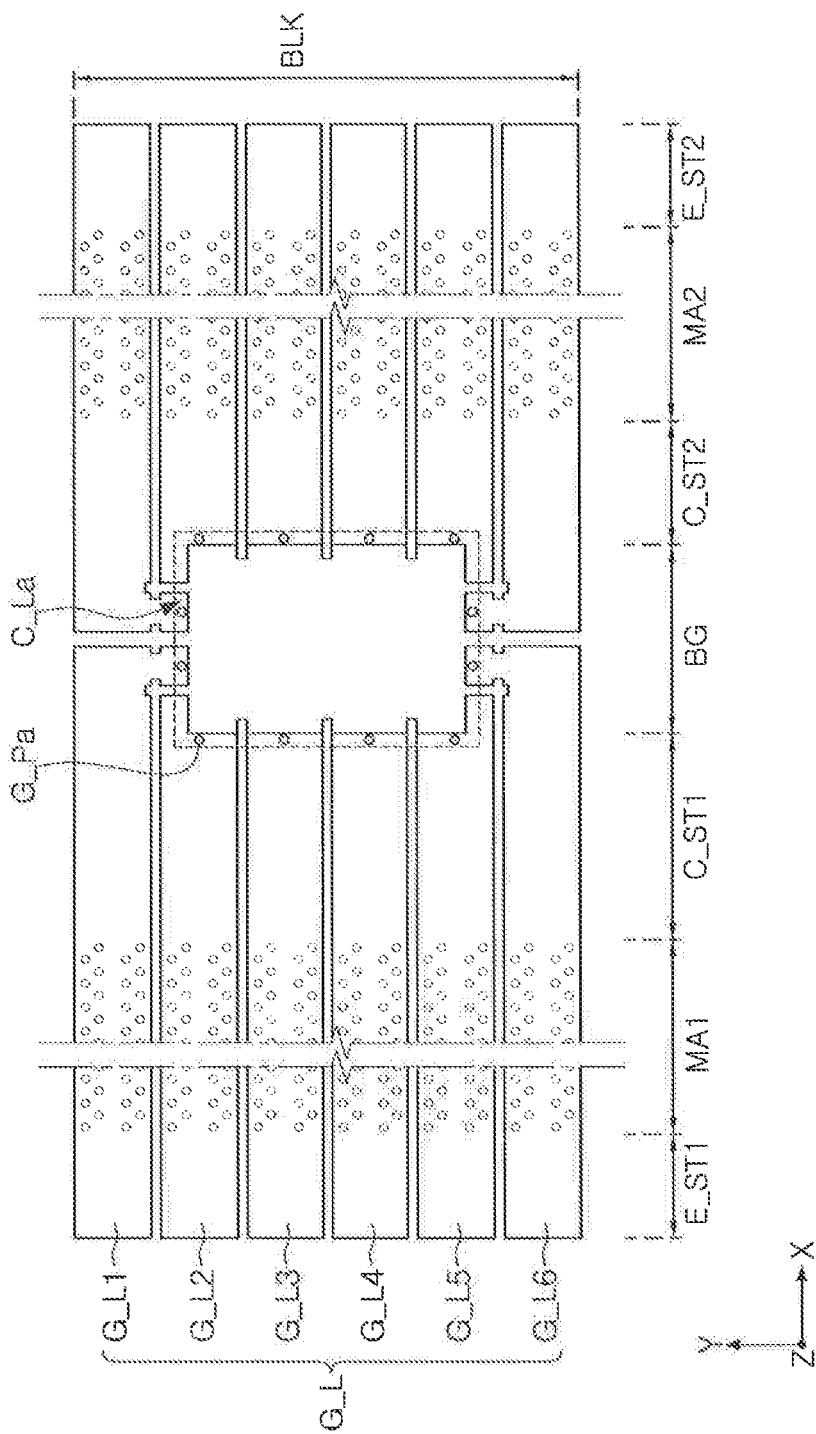
FIGS. 12 and 13 are plan views illustrating portions of gate electrodes of a three-dimensional semiconductor memory device according to an exemplary embodiment of the present inventive concept.
Figure 13:
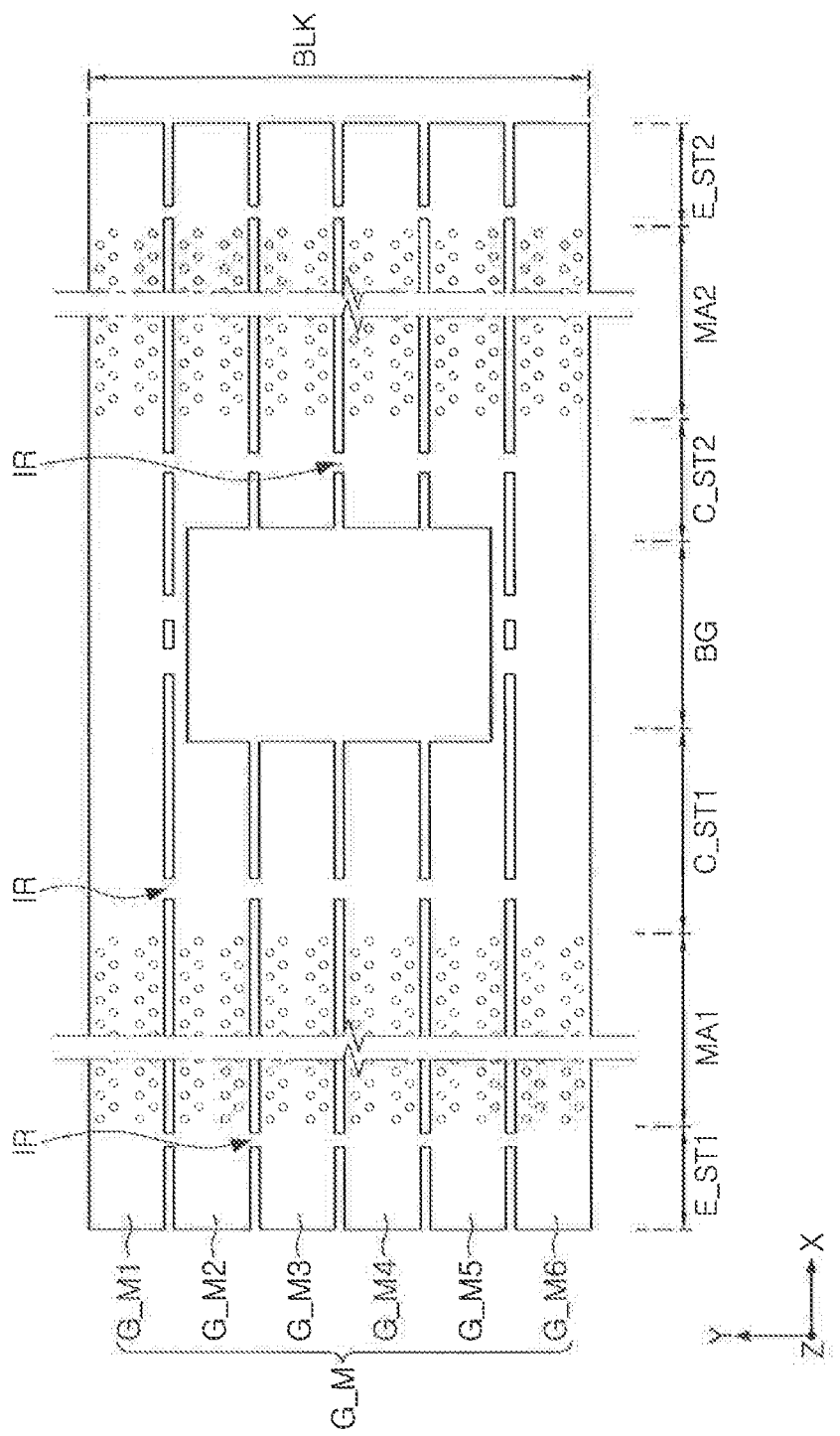

FIG. 11 is a plan view of a three-dimensional semiconductor memory device according to an exemplary embodiment of the present inventive concept. FIGS. 12 and 13 are plan views illustrating portions of gate electrodes of a three-dimensional semiconductor memory device according to an exemplary embodiment of the present inventive concept.

In FIGS. 11 to 13, description of the same portions and/or elements as those of FIGS. 3 to 10 may be omitted, and only the other portions may be described briefly.

Referring to FIG. 11, a portion of the auxiliary isolation structures SS, adjacent to the main isolation structure MS, may not include branch separation portions SSb extending from the first and second intermediate separation portions SSc1 and SSc2 in the second direction, the Y direction, in the bridge region BG.

A portion of the auxiliary isolation structures SS, adjacent to the main isolation structure MS, may include a dummy separation portion SSd disposed between the first and second intermediate separation portions SSc1 and SSc2 in the bridge region BG.

Referring to FIG. 12, in a manner similar to FIG. 9, the lower gate electrodes G_L may include six lower gate electrodes G_L1, G_L2, G_L3, G_L4, G_L5 and G_L6 spaced apart from each other in the second direction, the Y direction, on the same plane. Ends of the first to sixth lower gate electrodes G_L1, G_L2, G_L3, G_L4, G_L5 and G_L6 may provide the inner lower contact pads C_La disposed around the penetration region TH. Gate contact plugs G_Pa may be disposed on the inner lower contact pads C_La.

A portion of the first to sixth lower gate electrodes G_L1, G_L2, G_L3, G_L4, G_L5 and G_L6 may have a shape extending toward the penetration region TH (see, e.g., FIG. 3). The first lower gate electrode G_L1 and the sixth lower gate electrode G_L6, adjacent to the main isolation structure MS (see, e.g., FIG. 3), may each have an extended portion bent in the second direction, the Y direction, to provide the inner lower contact pad C_La, in the bridge region BG. The extended portion may include a region having a relatively narrow width. The first lower gate electrode G_L1 and the sixth lower gate electrode G_L6 may each have a recess recessed in the second direction, the Y direction, and adjacent to the extended portion.

Referring to FIG. 13, the intermediate gate electrode G_M may include six sub-intermediate gate electrodes G_M1, G_M2, G_M3, G_M4, G_M5 and G_M6 spaced apart from each other in the second direction, the Y direction, on the same plane. The first to sixth sub-intermediate gate electrodes G_M1, G_M2, G_M3, G_M4, G_M5 and G_M6 may be electrically connected to each other by the connection portions IR, in a manner similar to FIG. 10.

A second sub-intermediate gate electrode G_M2 and a fifth sub-intermediate gate electrode G_M5 may not have a disconnected portion in the bridge region BG. The second sub-intermediate gate electrode G_M2 and the fifth sub-intermediate gate electrode G_M5 may extend from the first and second memory cell array regions MA1 and MA2 to the bridge region BG, and may be connected to each other.

Figure 14:
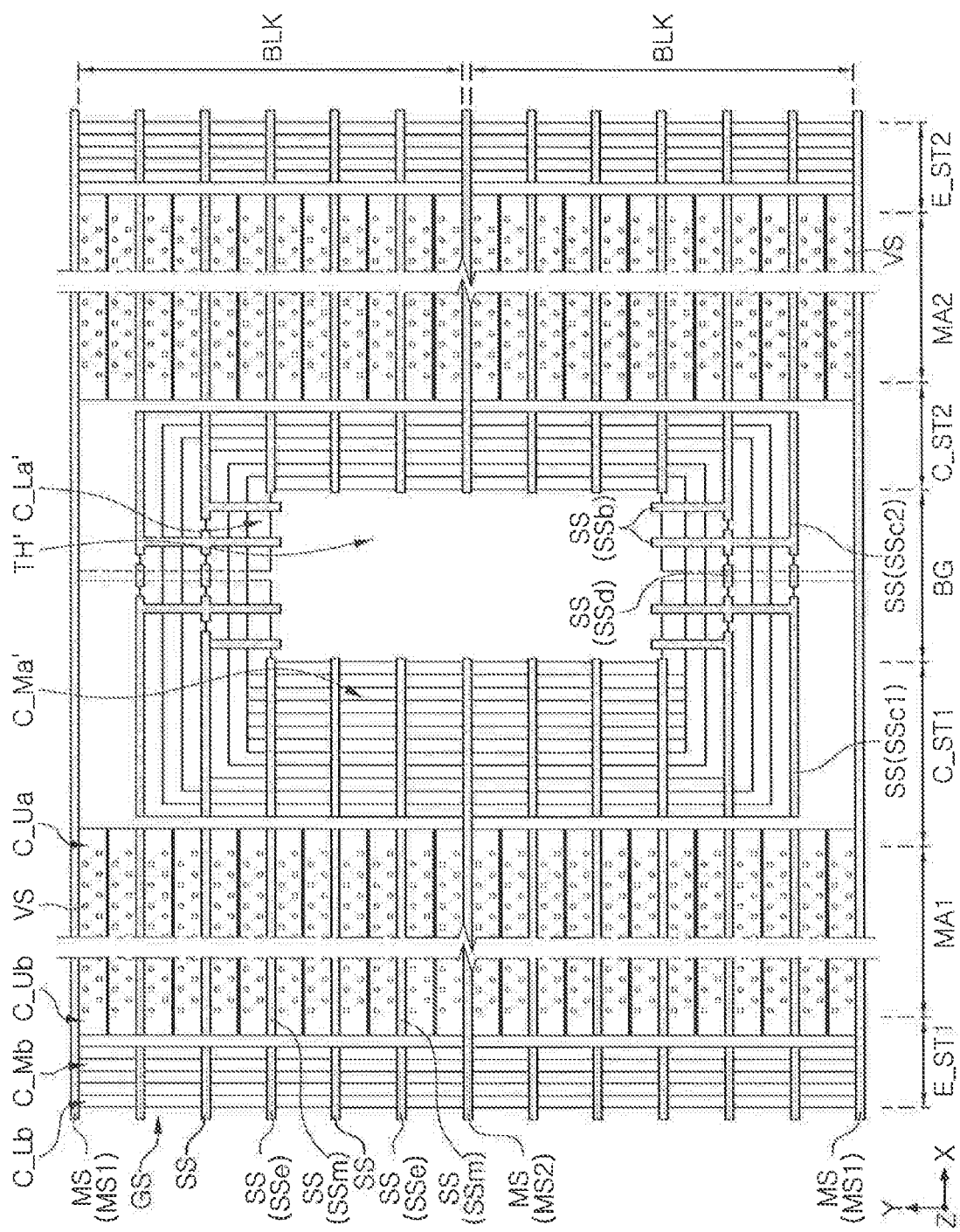
FIG. 14 is a plan view of a three-dimensional semiconductor memory device according to an exemplary embodiment of the present inventive concept.
Figure 15:
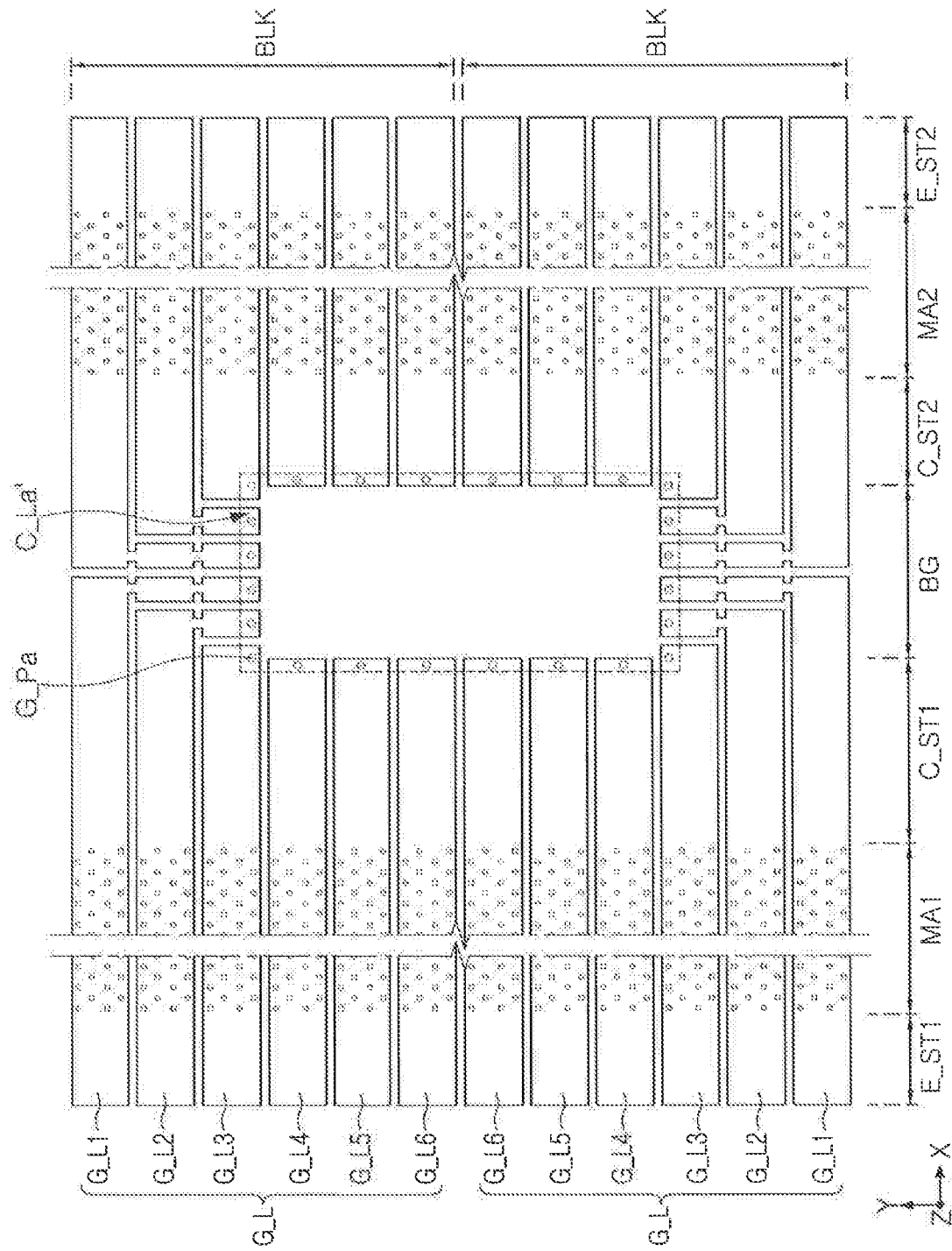
FIGS. 15 and 16 are plan views illustrating portions of gate electrodes of a three-dimensional semiconductor memory device according to an exemplary embodiment of the present inventive concept.
Figure 16:
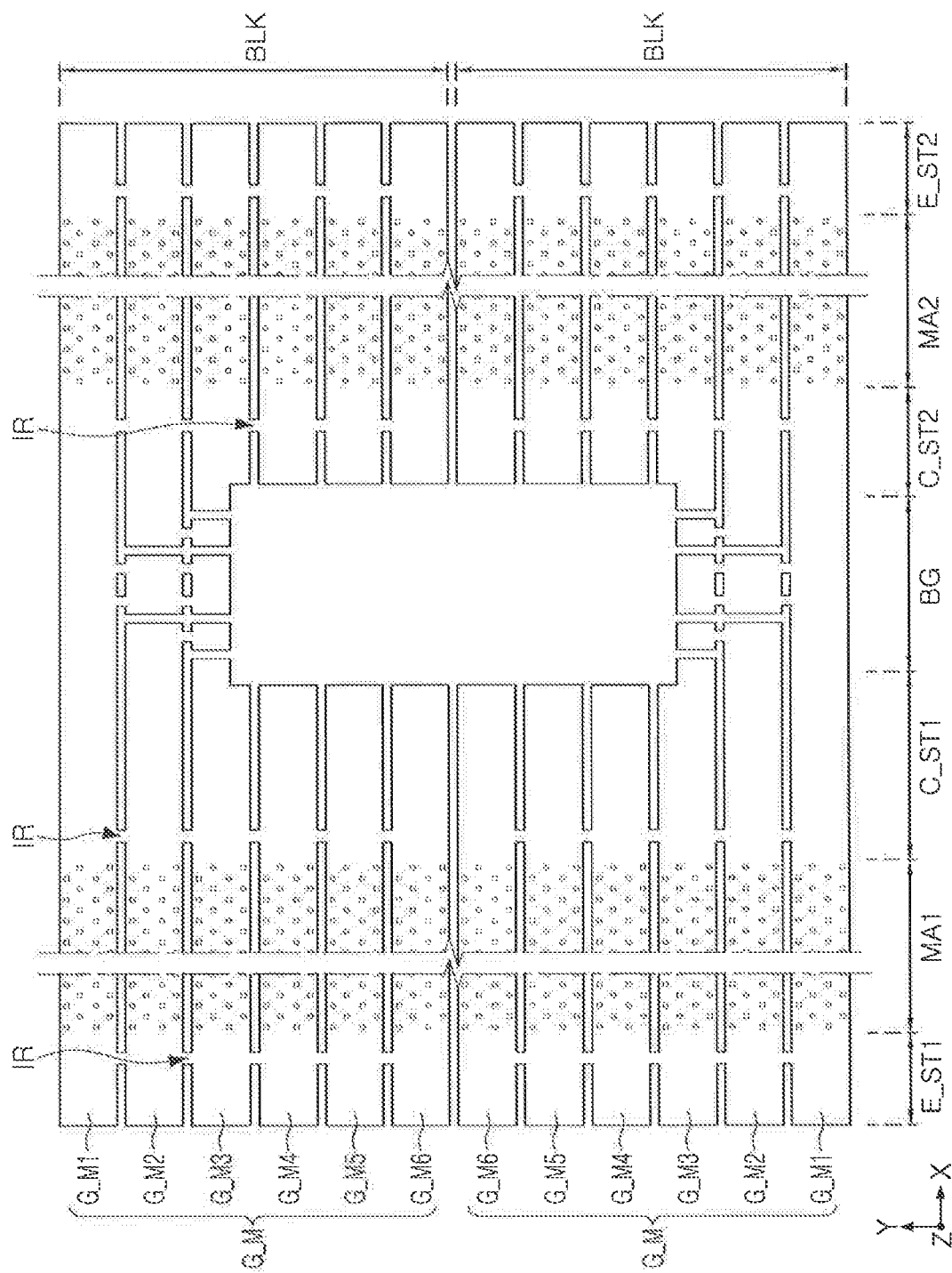

FIG. 14 is a plan view of a three-dimensional semiconductor memory device according to an exemplary embodiment of the present inventive concept. FIGS. 15 and 16 are plan views illustrating portions of gate electrodes of a three-dimensional semiconductor memory device according to an exemplary embodiment of the present inventive concept. FIG. 15 illustrates lower gate electrodes G_L disposed in two memory blocks BLK, and FIG. 16 illustrates intermediate gate electrodes G_M nearest to the lower gate electrodes G_L disposed in two memory blocks BLK.

Referring to FIGS. 14 to 16, a penetration region TH' may be disposed for a plurality of memory blocks, for example, every two memory blocks BLK. For example, a penetration region TH' is disposed in two memory blocks BLK.

Main isolation structures MS may be disposed to extend in the first direction, the X direction, while spacing the memory blocks BLK apart from each other in the second direction, the Y direction. The main isolation structures MS may divide the gate stack structure GS in the second direction Y. The main isolation structures MS may include first main isolation structures MS1 and a second main isolation structure MS2 between the first main isolation structures MS1.

The penetration region TH' may be disposed between the first main isolation structures MS1, and the second main isolation structure MS2 may divide the gate stack structure GS of the first and second inner stepped regions C_ST1 and C_ST2 adjacent to the penetration region TH' in the second direction, the Y direction. The second main isolation structure MS2 may have a length less than that of the first main isolation structure MS1, and may not traverse the penetration region TH'.

One memory block BLK may be disposed between the first main isolation structure MS1 and the second main isolation structure MS2.

On the same plane, the penetration region TH' may be surrounded by two intermediate gate electrodes G_M, for example, two word lines WL.

Five auxiliary isolation structures SS may be disposed between the first main isolation structure MS1 and the second main isolation structure MS2. Two auxiliary isolation structures SS adjacent to the first main isolation structure MS1, among the auxiliary isolation structures SS, may include branch separation portions SSb extending from the first and second intermediate separation portions SSc1 and SSc2 in the second direction, the Y direction, and a dummy separation portion SSd disposed between the first and second intermediate separation portions SSc1 and SSc2, in the bridge region BG. The branch separation portions SSb may extend toward the penetration region TH'. Lengths of the branch separation portions SSb may be different from each other, and may extend to the penetration region TH'.

Referring to FIG. 15, the lower gate electrodes G_L may be disposed in the first and second memory cell array regions MA1 and MA2, and may extend to the inner stepped regions C_ST1 and C_ST2. A portion of the lower gate electrodes G_L may extend into the bridge region BG. The lower gate electrodes G_L extending from the first and second memory cell array regions MA1 and MA2 may not be connected to each other in the bridge region BG, and may be spaced apart from each other in the first direction, the X direction.

The lower gate electrodes G_L in a single memory block BLK may include six lower gate electrodes G_L1, G_L2, G_L3, G_L4, G_L5 and G_L6 spaced apart from each other in the second direction, the Y direction, on the same plane. The first to sixth lower gate electrodes G_L1, G_L2, G_L3, G_L4, G_L5 and G_L6 may be electrically insulated from each other. Ends of the first to sixth lower gate electrodes G_L1, G_L2, G_L3, G_L4, G_L5 and G_L6 may provide the inner lower contact pads C_La disposed around the penetration region TH' (see, e.g., FIG. 14). Gate contact plugs G_Pa may be disposed on the inner lower contact pads C_La.

A portion of the first to sixth lower gate electrodes G_L1, G_L2, G_L3, G_L4, G_L5 and G_L6 may have a shape extending toward the penetration region TH' (see, e.g., FIG. 14). In a respective memory block BLK, the first lower gate electrode G_L1 and the second lower gate electrode G_L2 may be adjacent to the first main isolation structure MS1 (see, e.g., FIG. 14). The first lower gate electrode G_L1 and the second lower gate electrode G_L2 may each include an extended portion bent in the second direction, the Y direction, to provide the inner lower contact pad C_La' (see, e.g., FIG. 14) in the bridge region BG. The extended portion may extend toward the penetration region TH' (see, e.g., FIG. 14). The extended portion may include a region having a relatively narrow width. For example, the extended portion may extend while having a substantially constant width.

Referring to FIG. 16, intermediate gate electrodes G_M in the respective memory block BLK may be disposed in the first and second memory cell array regions MA1 and MA2, and may extend to the inner stepped regions C_ST1 and C_ST2 and the bridge region BG. The intermediate gate electrodes G_M may be connected to each other in the bridge region BG. For example, the intermediate gate electrodes G_M may be connected to each other in inner stepped regions C_ST1 and C_ST2.

On the same plane, the penetration region TH' (see FIG. 14) may be surrounded by two intermediate gate electrodes G_M, for example, two word lines WL.

In the respective memory block BLK, the intermediate gate electrode G_M may include six sub-intermediate gate electrodes G_M1, G_M2, G_M3, G_M4, G_M5 and G_M6 spaced apart from each other in the second direction, the Y direction, on the same plane. The first to sixth sub-intermediate gate electrodes G_M1, G_M2, G_M3, G_M4, G_M5 and G_M6 may be connected to each other by the connection portions IR. For example, the connection portions IR may connect the first to sixth sub-intermediate gate electrodes G_M1, G_M2, G_M3, G_M4, G_M5 and G_M6 to each other in the inner stepped regions C_ST1 and C_ST2 and the outer step regions E_ST1 and E._ST2.

In the respective memory block BLK, the first sub-intermediate gate electrode G_M1 may be adjacent to the first main isolation structure MS1 (see FIG. 14). The first sub-intermediate gate electrode G_M1 may extend from the first and second memory cell array regions MA1 and MA2 to the bridge region BG, and may be a single structure.

The second and third sub-intermediate gate electrodes G_M2 and G_M3 may have disconnected portions in the bridge region BG. For example, second and third sub-intermediate gate electrodes G_M2 and G_M3 may each include portions not directly connected to one another. The second sub-intermediate gate electrode G_M2 may have a shape bent in the second direction, the Y direction, in the bridge region BG.

Figure 17:
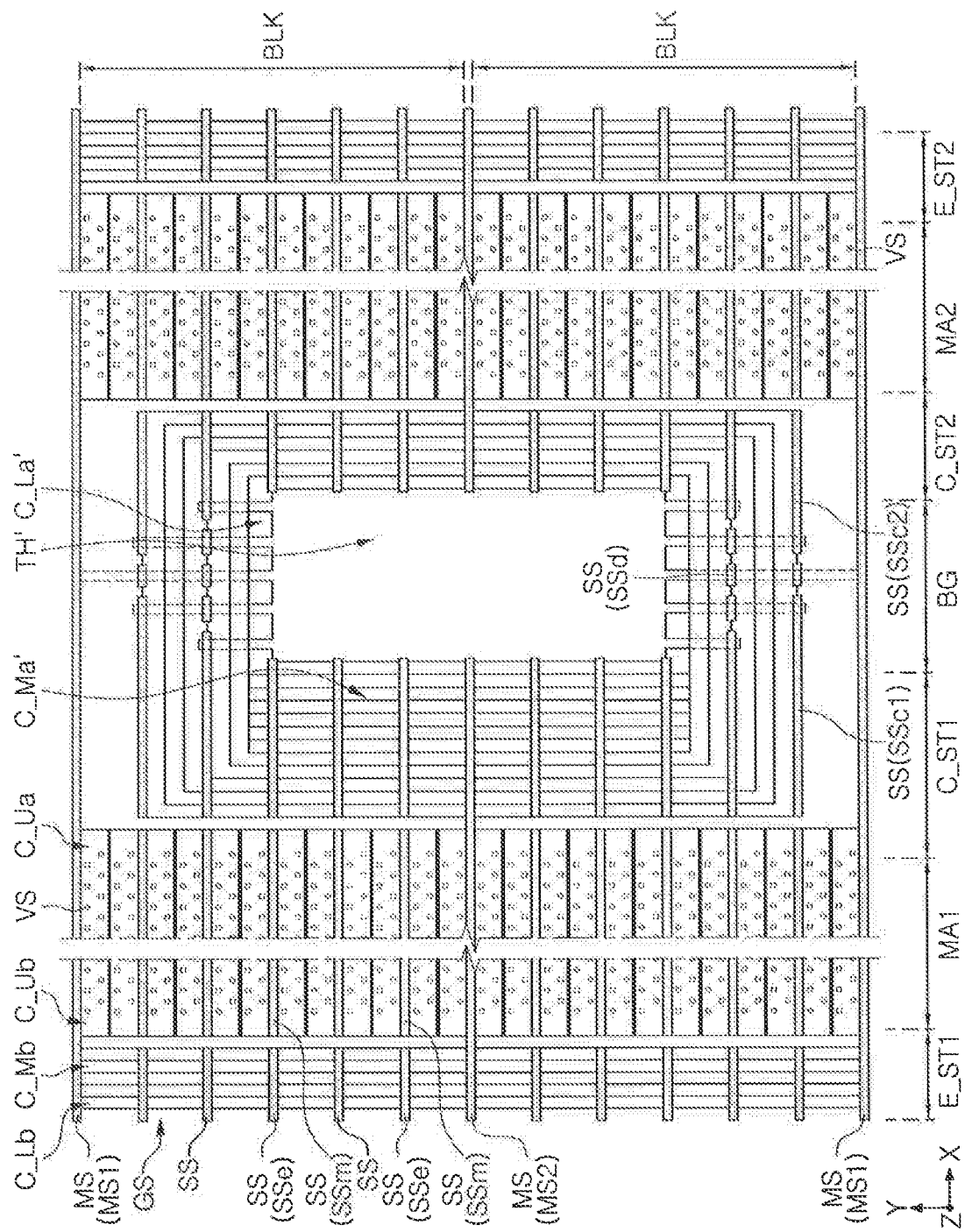
FIG. 17 is a plan view of a three-dimensional semiconductor memory device according to an exemplary embodiment of the present inventive concept.
Figure 18:
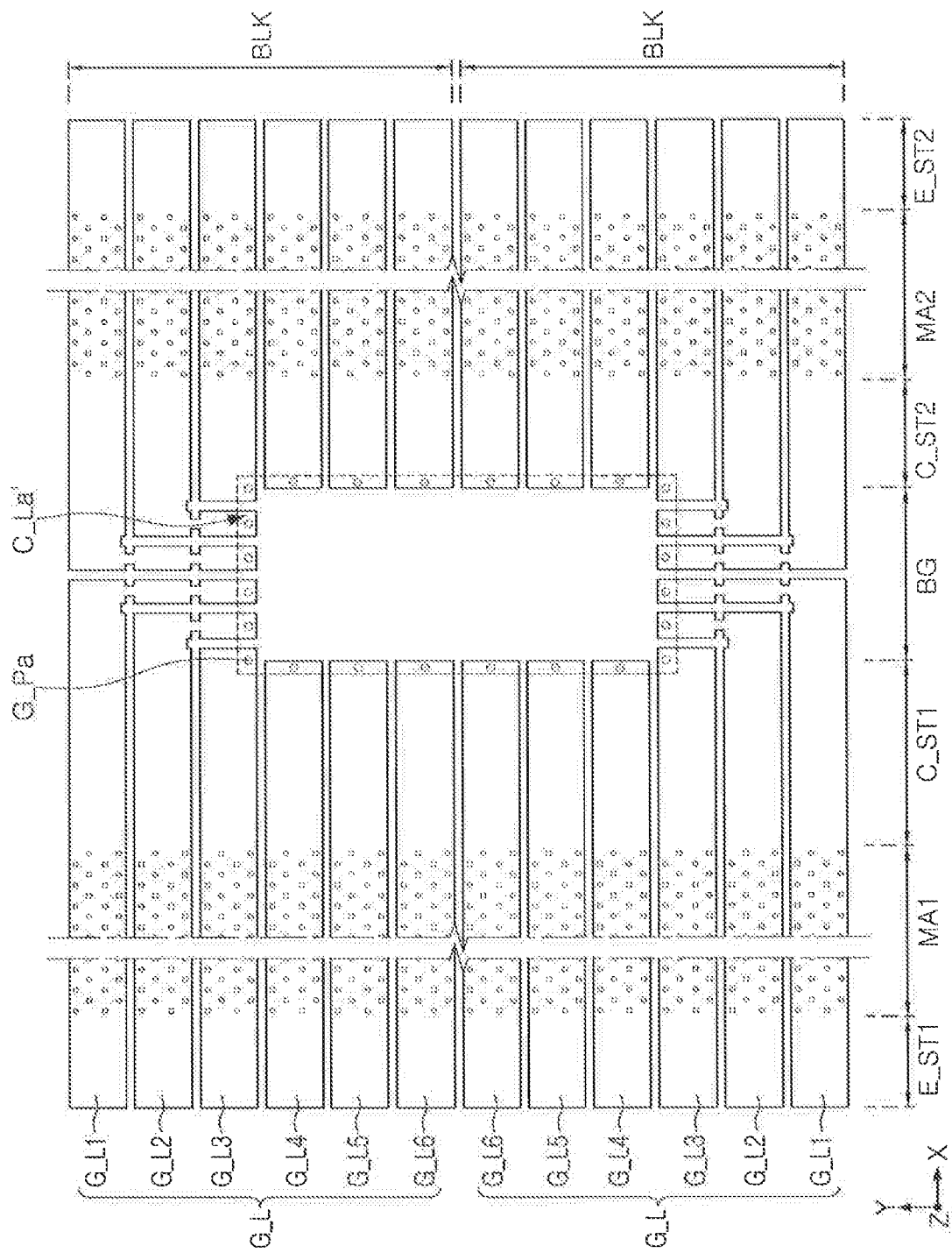
FIGS. 18 and 19 are plan views illustrating portions of gate electrodes of a three-dimensional semiconductor memory device according to an exemplary embodiment of the present inventive concept.
Figure 19:
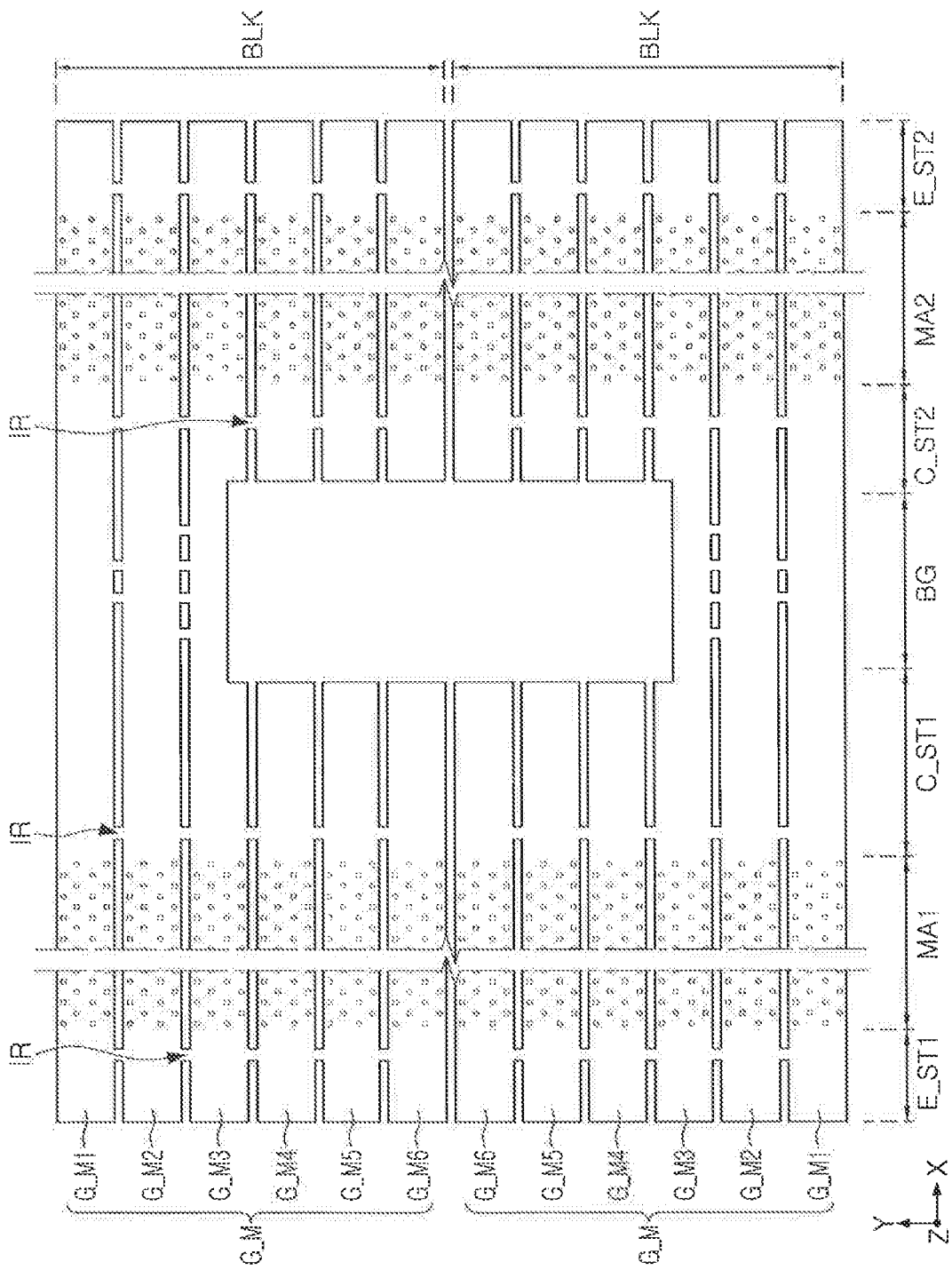

FIG. 17 is a plan view illustrating a three-dimensional semiconductor memory device according to an exemplary embodiment of the present inventive concept. FIGS. 18 and 19 are plan views illustrating portions of gate electrodes of a three-dimensional semiconductor memory device according to an exemplary embodiment of the present inventive concept.

In FIGS. 17 to 19, the description of the same portions and/or elements as those in FIGS. 14 to 16 may be omitted, and different portions may be described briefly.

Referring to FIG. 17, two auxiliary isolation structures SS adjacent to the first main isolation structure MS1, from among the auxiliary isolation structures SS, may not include branch separation portions SSb extending from the first and second intermediate separation portions SSc1 and SSc2 in the second direction, the Y direction, in the bridge region BG.

A portion of the auxiliary isolation structures SS, adjacent to the main isolation structure MS, may include a dummy separation portion SSd disposed between the first and second intermediate separation portions SSc1 and SSc2 in the bridge region BG.

Referring to FIG. 18, similarly to FIG. 15, in a single memory block BILK, the lower gate electrodes G_L may include six lower gate electrodes G_L1, G_L2, G_L3, G_L4, G_L5 and G_L6 spaced apart from each other in the second direction, the Y direction, on the same plane. Ends of the first to sixth lower gate electrodes G_L1, G_L2, G_L3, G_L4, G_L5 and G__L6 may provide the inner lower contact pads C_La' disposed around the penetration region TH' (see FIG. 17). Gate contact plugs may be disposed on the inner lower contact pads C_La'.

A portion of the first to sixth lower gate electrodes G_L1, G_L2, G_L3, G_L4, G_L5 and G_L6 may have a shape extending toward the penetration region TH' (see, e.g., FIG. 17). A first lower gate electrode G_L1 and a second lower gate electrode G_L2, adjacent to the first main isolation structure MS1 (see, e.g., FIG. 17), may each include an extended portion bent in the second direction, the Y direction, to provide the inner lower contact pad C_La', in the bridge region BG. The first lower gate electrode G_L1 and the second lower gate electrode G_L2 may each have a recess recessed in the second direction, the Y direction, and adjacent to the extended portion.

Referring to FIG. 19, a second sub-intermediate gate electrode G_M2 and a third sub-intermediate gate electrode G_M3 may not have a disconnected portion in the bridge region BG. The second sub-intermediate gate electrode G_M2 and the third sub-intermediate gate electrode G_M3 may extend from the first and second memory cell array regions MA1 and MA2 to the bridge region BG, and may be connected to each other.

As set forth above, a three-dimensional semiconductor memory device according to an exemplary embodiment of the present inventive concept may have a structure in which an area occupied by gate contact pads used to connect gate electrodes to a peripheral circuit may be reduced. Thus, the degree of integration of the three-dimensional semiconductor memory device may be increased.

While the present inventive concept has been particularly shown and described with reference to exemplary embodiments thereof, it will be apparent to those of ordinary skill in the art that various changes in form and detail may be made thereto without departing from the spirit and scope of the present inventive concept.

What is claimed is:

1. A three-dimensional semiconductor memory device, comprising:
    a base substrate;
    a gate stack structure disposed on the base substrate, and including gate electrodes stacked in a direction substantially perpendicular to a top surface of the base substrate;
    a penetration region penetrating through the gate stack structure and surrounded by the gate stack structure; and
    vertical channel structures passing through the gate stack structure,
    wherein lowermost gate electrodes among the gate electrodes are spaced apart from each other, and a portion of at least one of the lowermost gate electrodes has a shape bent toward the penetration region.

2. The three-dimensional semiconductor memory device of claim 1, further comprising main isolation structures extending in a first direction parallel to the top surface of the base substrate, while penetrating through the gate stack structure,
    wherein the penetration region is disposed between the main isolation structures.

3. The three-dimensional semiconductor memory device of claim 2, further comprising a plurality of auxiliary isolation structures passing through the gate stack structure, disposed between the main isolation structures, and having a plurality of portions spaced apart from each other in the first direction,
    wherein a first portion of the plurality of portions of the plurality of auxiliary isolation structures further comprises an extended portion extending in a second direction intersecting the first direction.

4. The three-dimensional semiconductor memory device of claim 1, wherein the gate stack structure comprises a first gate stack structure and a second gate stack structure stacked on the first gate stack structure, the first gate stack structure comprises first contact pads adjacent to the penetration region and arranged to have a stepped shape, the second gate stack structure comprises second contact pads adjacent to the penetration region and arranged to have a stepped shape, and at least a portion of the second contact pads overlaps the first contact pads on one side of the penetration region.

5. The three-dimensional semiconductor memory device of claim 4, wherein the vertical channel structures comprise a first vertical channel structure passing through the first gate stack structure and a second vertical channel structure passing through the second gate stack structure, and the first and second vertical channel structures each comprise a channel semiconductor layer.

6. The three-dimensional semiconductor memory device of claim 4, further comprising gate contact plugs connected to the gate electrodes, wherein a first plurality of the gate contact plugs is disposed on the second contact pads, and a second plurality of the gate contact plugs is disposed on the first contact pads not overlapped with the second contact pads.

7. The three-dimensional semiconductor memory device of claim 6, further comprising:

peripheral contact plugs electrically connected to a peripheral circuit below the base substrate, while passing through the penetration region; and connection wirings electrically connecting the gate contact plugs and the peripheral contact plugs.

8. A three-dimensional semiconductor memory device, comprising:

a base substrate;

memory cell array regions disposed on the base substrate;

a first inner stepped region and a second inner stepped region disposed between the memory cell array regions;

a bridge region disposed between the first and second inner stepped regions;

a gate stack structure including word lines stacked in the memory cell array regions and extending to the first and second inner stepped regions in a first direction, and lower select lines disposed below the word lines; and a penetration region penetrating through the gate stack structure in the bridge region, wherein the word lines respectively extend from the memory cell array regions to the bridge region and are connected in the bridge region, the lower select lines are spaced apart from each other in the bridge region, and a portion of at least one of the lower select lines includes an extended portion bent in a second direction intersecting the first direction.

9. The three-dimensional semiconductor memory device of claim 8, wherein a length of the gate stack structure disposed in the second inner stepped region in the first direction is less than a length of the gate stack structure disposed in the first inner stepped region.

10. The three-dimensional semiconductor memory device of claim 8, wherein, the gate stack structure comprises a first gate stack structure and a second gate stack structure stacked on the base substrate, the word lines of the first gate stack structure include first contact pads arranged to have a stepped shape in the first and second inner stepped regions, and the word lines of the second gate stack structure include second contact pads arranged to have a stepped shape in the second inner stepped region, and the second contact pads are spaced apart from the first contact pads in the first direction in the first inner stepped region, and the second contact pads overlap the first contact pads in the second inner stepped region.

11. The three-dimensional semiconductor memory device of claim 10, further comprising:

a lower substrate disposed below the base substrate;

a lower structure disposed between the lower substrate and the base substrate, and including a peripheral circuit; and a gap-fill insulating layer penetrating through the base substrate, wherein the gap-fill insulating layer overlaps the penetration region.

12. The three-dimensional semiconductor memory device of claim 11, further comprising:

one or a plurality of gate contact plugs disposed on the second contact pads in the second inner stepped region;

one or a plurality of peripheral contact plugs, electrically connected to the peripheral circuit, and passing through the penetration region and the gap-fill insulating layer; and one or a plurality of connection wirings electrically connecting the one or the plurality of gate contact plugs and the one or the plurality of peripheral contact plugs to each other.

13. The three-dimensional semiconductor memory device of claim 10, wherein the first and second contact pads are each arranged in the stepped shape, wherein the stepped shape lowers in a direction toward the penetration region.

14. The three-dimensional semiconductor memory device of claim 8, wherein the penetration region is surrounded by a single word line.

15. The three-dimensional semiconductor memory device of claim 8, wherein the penetration region is surrounded by two word lines.

16. The three-dimensional semiconductor memory device of claim 10, further comprising vertical channel structures passing through the gate stack structure in the memory cell array regions, wherein the vertical channel structures comprise a first vertical channel structure passing through the first gate stack structure, and a second vertical channel structure passing through the second gate stack structure, and an upper end of the first vertical channel structure is in contact with a lower end of the second vertical channel structure.

17. A three-dimensional semiconductor memory device, comprising:

a base substrate;

a first gate stack structure and a second gate stack structure stacked on the base substrate;

a penetration region surrounded by the first and second gate stack structures, and penetrating through the first and second gate stack structures; and vertical channel structures passing through the first and second gate stack structures, wherein the first and second gate stack structures include word lines extending in a first direction, and the first gate stack structure further includes lower select lines disposed below the word lines, and a portion of at least one of the lower select lines includes an extended portion bent toward the penetration region in a second direction different from the first direction, wherein a lower contact pad is disposed on the extended portion.

18. The three-dimensional semiconductor memory device of claim 17, wherein, the word lines of the first gate stack structure comprise first intermediate contact pads, arranged to have a stepped shape that lowers toward the penetration region and surrounds the penetration region, the word lines of the second gate stack structure comprise second intermediate contact pads, arranged to have a stepped shape that lowers toward the penetration region and surrounds the penetration region, and the second intermediate contact pads cover a portion of the first intermediate contact pads.

19. The three-dimensional semiconductor memory device of claim 17, further comprising:

main isolation structures extending in a first direction parallel to a surface of the base substrate and passing through the first and second gate stack structures; and auxiliary isolation structures disposed between the main isolation structures and extending in the first direction, wherein the penetration region is disposed between the main isolation structures; and a first portion of the auxiliary isolation structures passes through the first and second intermediate contact pads, and a second portion of the auxiliary isolation structures comprises a portion extending in the second direction.

20. The three-dimensional semiconductor memory device of claim 17, further comprising:

a lower substrate disposed below the base substrate;

a lower structure disposed between the lower substrate and the base substrate, and including a peripheral circuit;

a gap-fill insulating layer overlapping the penetration region and passing through the base substrate;

a peripheral contact plug electrically connected to the peripheral circuit and passing the penetration region and the gap-fill insulating layer;

a gate contact plug electrically connected to at least one of the first and second intermediate contact pads; and a gate connection wiring electrically connecting the peripheral contact plug and the gate contact plug to each other.

* * * * *